(12) United States Patent
Asano et al.

(10) Patent No.: US 7,449,711 B2
(45) Date of Patent: Nov. 11, 2008

(54) PHASE-CHANGE-TYPE SEMICONDUCTOR MEMORY DEVICE

(75) Inventors: Isamu Asano, Tokyo (JP); Tsuyoshi Kawagoe, Tokyo (JP); Yukio Fuji, Tokyo (JP); Kiyoshi Nakai, Tokyo (JP); Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 205 days.

(21) Appl. No.: 11/329,224

(22) Filed: Jan. 11, 2006

(65) Prior Publication Data

US 2006/0151771 A1 Jul. 13, 2006

(30) Foreign Application Priority Data

Jan. 12, 2005 (JP) ............................. 2005-005310

(51) Int. Cl.
*H01L 47/00* (2006.01)
(52) U.S. Cl. .................. 257/4; 257/2; 257/5; 257/506; 257/544; 257/E31.029

(58) Field of Classification Search .................. 257/2–5, 257/506, 544, 653
See application file for complete search history.

(56) References Cited

U.S. PATENT DOCUMENTS 5,166,758 A * 11/1992 Ovshinsky et al. ............. 257/3
2006/0284157 A1* 12/2006 Chen et al. ....................... 257/2

FOREIGN PATENT DOCUMENTS

JP 5-21740 1/1993

* cited by examiner

*Primary Examiner*—A. Sefer
*Assistant Examiner*—Scott R Wilson
(74) *Attorney, Agent, or Firm*—McGinn IP Law Group, PLLC

(57) ABSTRACT

A phase-change memory device includes a plurality of bit lines extending in a row direction, a plurality of selection lines extending in a column direction, and an array of memory cells each disposed at one of intersections between the bit lines and selection lines. Each memory cell includes a chalcogenide element and a diode connected in series, and an n-type contact layer underlying the n-type layer of the diode. Adjacent two of memory cells share a common bit-line contact plug connecting the n-type contact layers and the bit line.

17 Claims, 24 Drawing Sheets

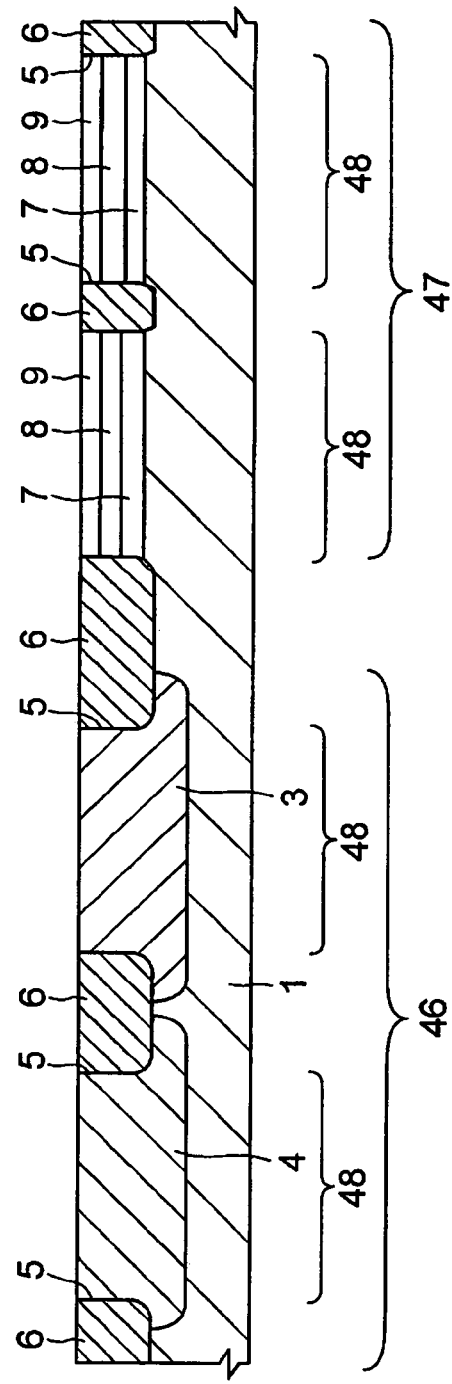
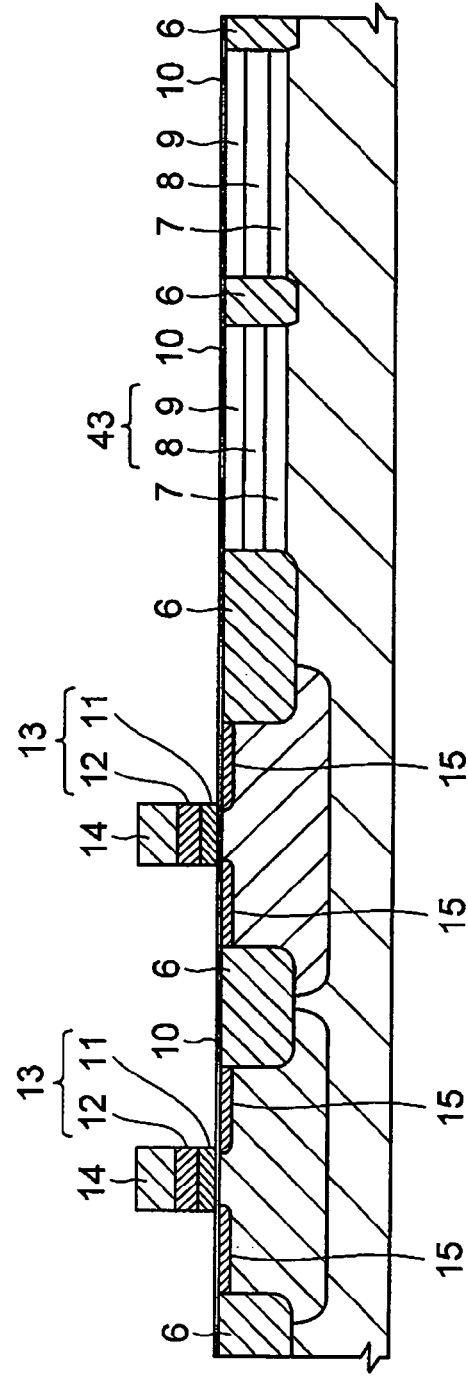
Fig. 4A
Fig. 4B

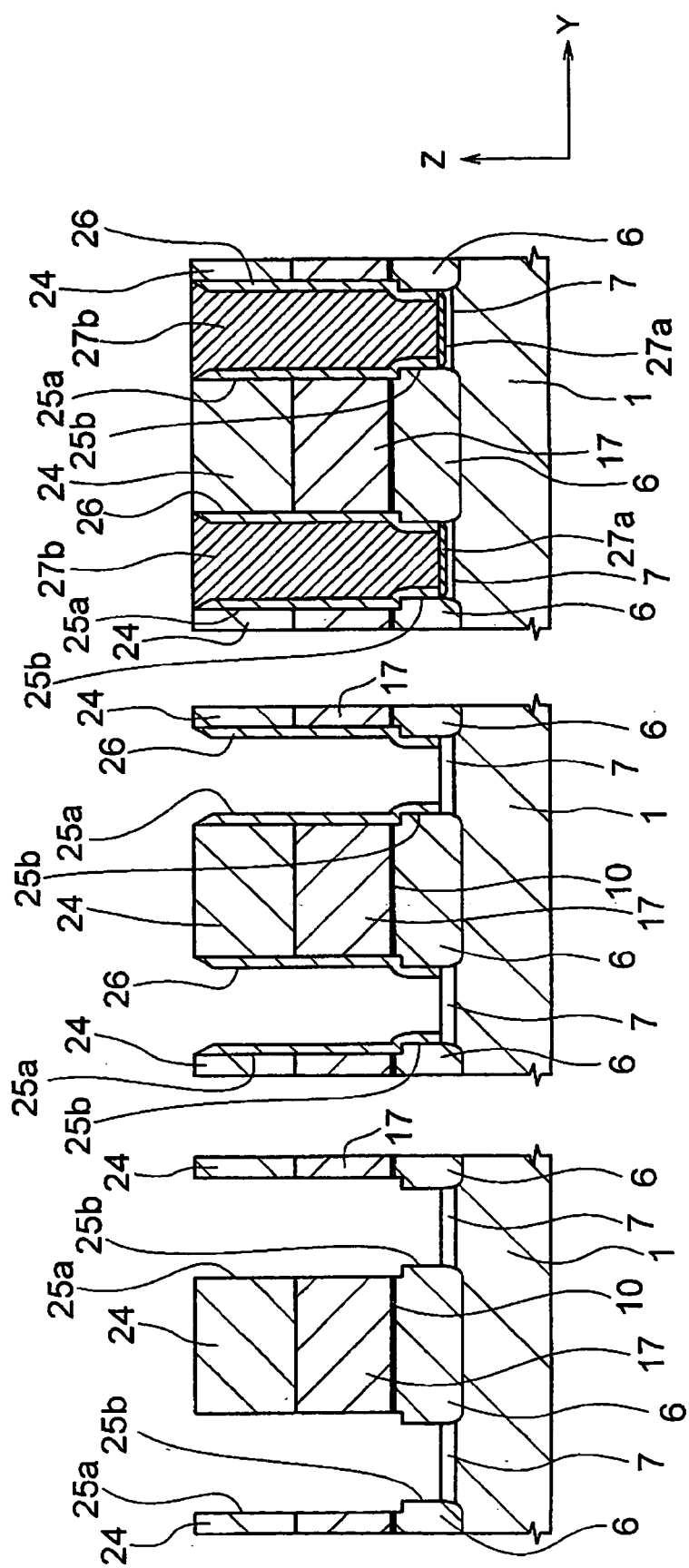

PHASE-CHANGE-TYPE SEMICONDUCTOR MEMORY DEVICE

BACKGROUND OF THE INVENTION (a) Field of the Invention

The present invention relates to a phase-change-type semiconductor memory device and, more particularly to a memory device having phase-change-type memory cells. The present invention also relates to a method for manufacturing the same.

(b) Description of the Related Art

Phase-change-type random-access-memory (PCRAM) devices are known wherein phase-change materials (chalcogenides) are used as memory elements. The PCRAM device has the advantages of a non-volatile storage function, a higher-speed operation and a higher capacity, and thus attracts a larger attention in these days. U.S. Pat. No. 6,531,373 describes a PCRAM device, which will be described hereinafter with reference to FIGS. 10A and 10B.

In FIG. 10A, the PCRAM device 200 includes a plurality of bit lines BL (BL0 to BLn) extending in the row direction, a plurality of selection lines SL (SL1 to SLm) extending in the column direction, and a plurality memory cells, i.e., PCRAM cells 51 each disposed at a corresponding one of the intersections between the bit lines BL and selection lines SL. The PCRAM cells 51 each include a phase-change memory element, i.e., chalcogenide element 52 and a diode 53 having a p-n junction. The PCRAM cell 51 is connected between a corresponding one of the bit lines BL and a corresponding one of the selection lines SL such that the direction from the selection line SL to the bit line BL is the forward direction of the diode 53.

The chalcogenide element 52 is switched by a specific heat treatment from an amorphous state to a crystallized state, and vice versa. The chalcogenide element 52 stores information "1" or "0" corresponding to, for example, the amorphous state or crystallized state. The diode 53 is inserted therein for the purpose of preventing a so-called disturbance, i.e., preventing an unselected memory cell from being rewritten during rewriting of a selected memory cell, which is connected to the same bit line to which the unselected memory cell is connected. The diodes 53 may be replaced by selection switches such as MOSFETs.

To read data from the selected memory cell 51, a voltage is applied having a polarity such that the direction from a corresponding selection line SL to a corresponding bit line BL is the forward direction of the diode 53. Since the phase-change memory cell 52 generally has different electric resistances depending on the states thereof, the memory cell passes different currents depending on the states thereof during the voltage application. Thus, the data stored in the memory cell 51 can be identified by measurement of the current flowing through the memory cell 51 during the voltage application, after amplifying the current by using a sense amplifier (SA) 54.

As shown in FIG. 10B, on a semiconductor substrate 110 is formed a silicon layer with an intervention of an insulating film 120 therebetween to form a SOI (Silicon-on-Insulator) substrate 201. The area of the silicon layer is divided by a shallow trench isolation region 130 into a plurality of active regions 250. Each of the active regions 250 includes an n-type semiconductor region 150 and a p-type semiconductor region 160, which configure therebetween the p-n junction of the diode 53.

On the p-type semiconductor region 160 is formed a chalcogenide film 290 with an intervention of a contact region 260 therebetween. The selection lines 315 are formed on the chalcogenide film 290 with an intervention of barrier metal films 300 and 301. On the n-type semiconductor region 150 is formed a bit-line contact plug 350 with an intervention of a contact region 360 therebetween. The bit-line contact plug 350 is connected to the overlying bit line 140. A similar PCRAM device is also described in JP-A-5-21740.

DISCLOSURE OF THE INVENTION (a) Problem to be Solved by the Invention

In the PCRAM device described in U.S. Pat. No. 6,531,373, the p-type semiconductor region 160 and n-type semiconductor region 150 configuring therebetween a p-n junction are arranged in the lateral direction. In addition, the bit-line contact plugs 350 are arranged each for a corresponding memory cell. For achieving a higher-density arrangement and thus a larger capacity of the PCRAM device, it is desired to restructure those components in the PCRAM device.

In view of the above, it is an object of the present invention to improve the memory cells in the conventional PCRAM device to provide an improved semiconductor memory device having a phase-change memory cell, which is capable of being densely arranged and thus capable of achieving a larger capacity.

It is another object of the present invention to provide a method for manufacturing such a PCRAM device.

(b) Means for Solving the Invention

The present invention provides, in a first aspect thereof, a semiconductor memory device including: a semiconductor substrate; a plurality of bit lines overlying the semiconductor substrate and extending parallel to one another; a plurality of selection lines overlying the semiconductor substrate, extending parallel to one another, and intersecting the bit lines; and an array of phase-change memory cells each disposed for one of intersections between the bit lines and the selection lines, each of the memory cells being connected between a corresponding one of the bit lines and a corresponding one of the selection lines, wherein adjacent two of the memory cells share a single bit-line contact plug connected to a corresponding one of the bit lines.

The present invention also provides, in a second aspect thereof, a method for manufacturing a semiconductor memory device including: forming an isolation region to divide an area of a semiconductor substrate into an array of active regions; consecutively forming in each of the active regions an n-type contact layer, an n-type semiconductor layer and a p-type semiconductor layer, the n-type semiconductor layer and the p-type semiconductor layer configuring a p-n junction; forming in each of the active regions a contact plug having a bottom in contact with the n-type contact layer and having a sidewall insulation film, the sidewall insulation film dividing the diode in the each of the active regions into two divided diodes; forming a phase-change memory element corresponding to each of the divided diodes, the phase-change memory element having first and second electrodes, the first electrode being connected to the p-type semiconductor layer; and forming a plurality of bit lines each connected to the contact plugs in the active regions arranged in a row of the array, and a plurality of selection lines each connected to second electrodes in the active regions arranged in a column of the array.

The present invention also provides, in a third aspect thereof, a method for manufacturing a semiconductor memory device including: forming an isolation region to divide an area of a semiconductor substrate into an array of active regions; consecutively forming in each of the active regions an n-type contact layer, an n-type semiconductor layer and a p-type semiconductor layer, the n-type semiconductor layer and the p-type semiconductor layer configuring a p-n junction; forming a contact plug having a sidewall insulation film between adjacent two of the active regions, the contact plug connecting together the n-type contact layers in the adjacent two of the active regions; forming in each of the active regions a phase-change memory element having first and second electrodes, the first electrode being connected to the p-type semiconductor layer; and forming a plurality of bit lines each connected to the contact plugs in the active regions arranged in a row of the array, and a plurality of selection lines each connected to second electrodes in the active regions arranged in a column of the array.

In accordance with the semiconductor device of the present invention and a semiconductor memory device manufactured by the method of the present invention, the configuration wherein the adjacent two of memory cells share a single bit-line contact plug allows a higher-density arrangement of the memory cells, and thus achieves a larger capacity of the memory device.

The above and other objects, features and advantages of the present invention will be more apparent from the following description, referring to the accompanying drawings.

BRIEF DESCRIPTION OF THE DRAWINGS

FIGS. 4A to 4L are sectional views of a semiconductor device according to the first embodiment in consecutive steps of fabrication process thereof except for FIG. 4H, which shows the same step as FIG. 4G in a different section.

BEST MODE FOR CARRYING OUT THE INVENTION

Figure 1:
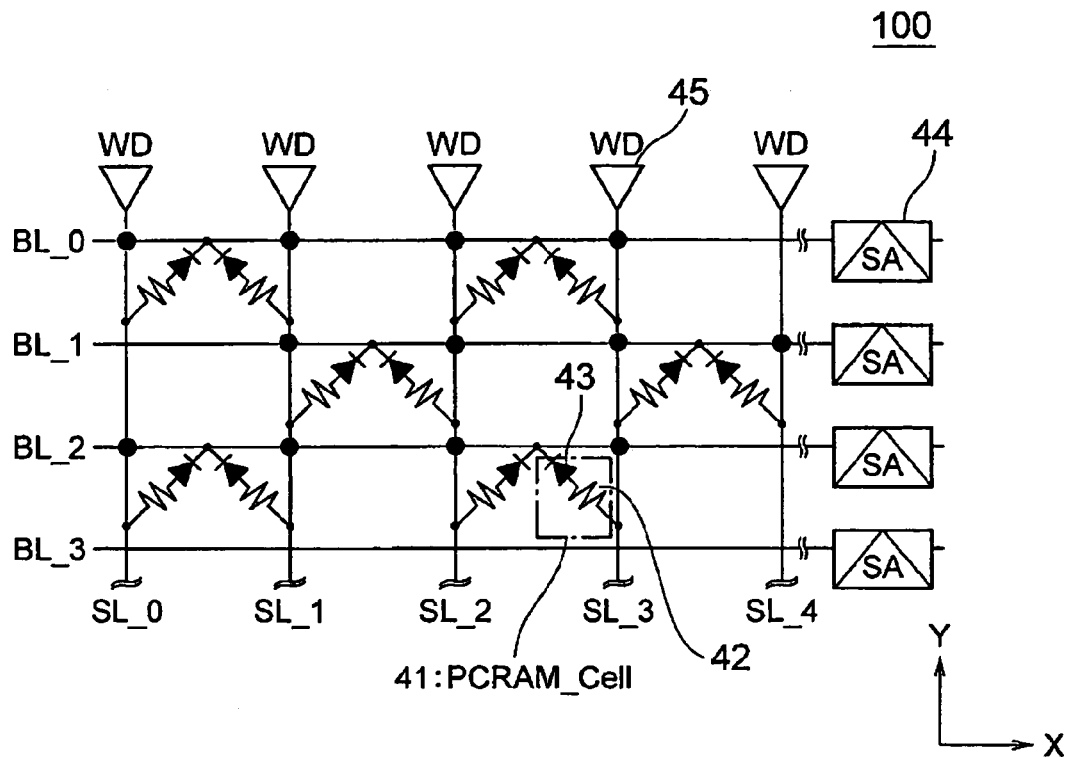
FIG. 1 is a circuit diagram of a semiconductor memory device according to a first embodiment of the present invention.

Now the present invention will be described with reference to preferable embodiments thereof.

It is preferable in the present invention that each of the memory cells include a phase-change memory element and a diode connected in series with the phase-change memory n-type semiconductor layer electrically connected to the bit-line contact plug and a p-type semiconductor layer overlying the n-type semiconductor layer.

It is also preferable in the present invention that the diodes in the adjacent two of the memory cells configure a pair of diodes formed in a single active region, and both diodes in the pair are isolated from each other by an insulating film covering the shared bit-line contact plug.

In an alternative, the diodes in the adjacent two of the memory cells configure a pair of diodes formed in separate active regions, and the n-type semiconductor layers in the pair of diodes are connected together by the shared bit-line contact plug.

In another alternative, the each of shared bit-line contact plugs penetrates the n-type and p-type semiconductor layers while isolated therefrom and is in contact with another n-type semiconductor layer which underlies the n-type semiconductor layer in contact therewith.

The bit lines may be disposed to overlie or underlie the selection lines. It is also a preferable embodiment that, if the selection lines overlie the bit lines, each of the bit lines have a sidewall insulation film, and a contact plug connecting together one of the selection lines and one of the memory cells be deposited in self-alignment with the sidewall insulation film.

In a semiconductor device according to a most preferred embodiment, adjacent two of the phase-change memory cells include a p-type semiconductor layer and an n-type semiconductor layer, which are arranged in a vertical direction to configure the diodes and disposed right beneath the bottom electrodes. The adjacent two memory cells also share a bit-line contact plug disposed between the two memory cells. At least a portion of the shared bit-line contact plug penetrates the p-type and n-type semiconductor layers to be in electric contact with one of the semiconductor layers of the diodes.

Now, embodiments of the present invention are more specifically described with reference to accompanying drawings, wherein similar constituent elements are designated by similar reference numerals.

FIG. 1 shows a circuit diagram of a PCRAM device shown as a semiconductor memory device according to a first embodiment of the present invention. The PCRAM device 100 includes a memory cell array including a plurality of selection lines SL (SL0 to SLn) extending in a column direction (Y-direction) and a plurality of bit lines BL (BL0 to BLm) extending in a row direction (X-direction) and an array of memory cells (PCRAM cells) 41 each disposed to a corresponding one of intersections between the selection lines SL and the bit lines BL.

Each memory cell 41 includes a phase-change memory element (chalcogenide element) 42, and a diode 43 having a p-n junction and connected in series with the chalcogenide element 42. Each memory cell 41 is connected between a corresponding one of the selection lines SL and a corresponding one of the bit lines BL such that the n-pole of the diode 43 is connected to the corresponding bit line BL. The bit lines BL are connected to respective sense amplifiers (SA) 44, and one ends of the selection lines SL are connected to respective word drivers (WD) 45.

Figure 2:
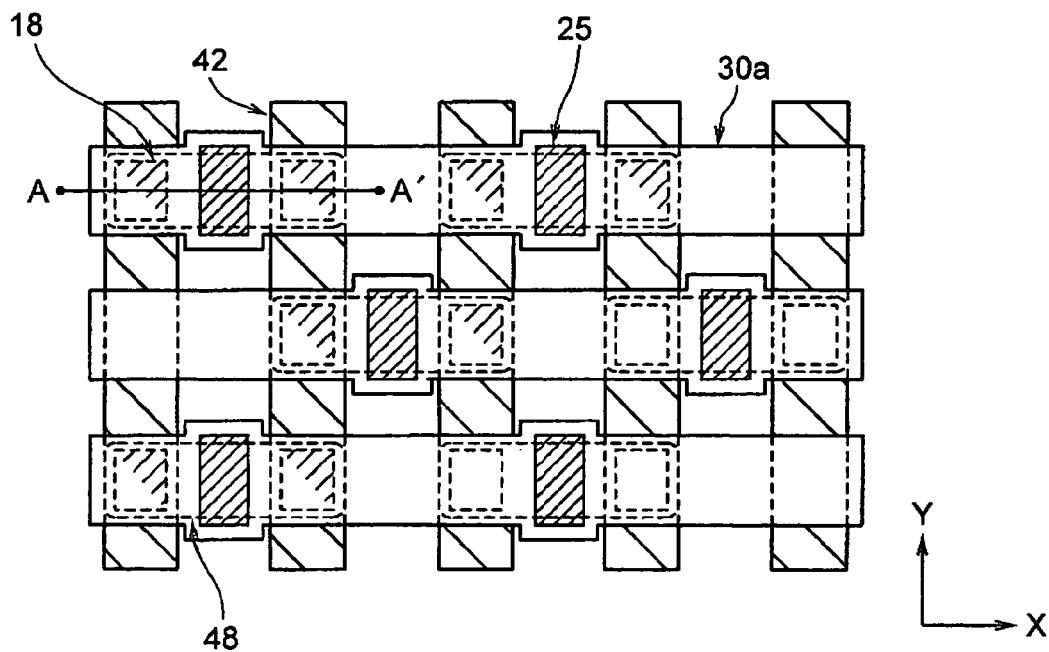
FIG. 2 is a partial top plan view of the pattern in the semiconductor memory device of FIG. 1.

FIG. 2 is an enlarged partial top plan view of the film patterns in the PCRAM cell array shown in FIG. 1. It is to be noted that each of the accompanying top plan views including FIG. 2 only shows schematic patterns of the components in the PCRAM device 100, and thus do not show the actual shape of the components. For example, although the patterns are depicted to have rectangular shapes in those figures, the actual shapes may have round apexes or obtuse angles.

In the PCRAM cell array 100, the selection lines SL extend in the Y-direction (column direction), whereas the bit lines BL extend in the X-direction (row direction). The chalcogenide elements 42 extend in the column direction while connecting areas in which the selection lines SL and the bit lines BL overlap one another. The chalcogenide elements 42 have a structure wherein a phase change material (chalcogenide) is sandwiched between a pair of electrode layers including a top electrode and a bottom electrode. The bottom electrode is connected to the p-type semiconductor layer configuring the p-pole of the p-n junction of the diode 43, and the n-type semiconductor layer configuring the n-pole of the p-n junction is connected to the overlying bit line BL via the bit-line contact plug 25. On the other hand, the top electrode is formed to have a pattern similar to the pattern of the chalcogenide element 42 and configures the selection line SL. The active regions 48 are each provided with a pair of bottom-electrode contact holes 18, which are disposed corresponding to a single bit-line contact hole.

Figure 3:
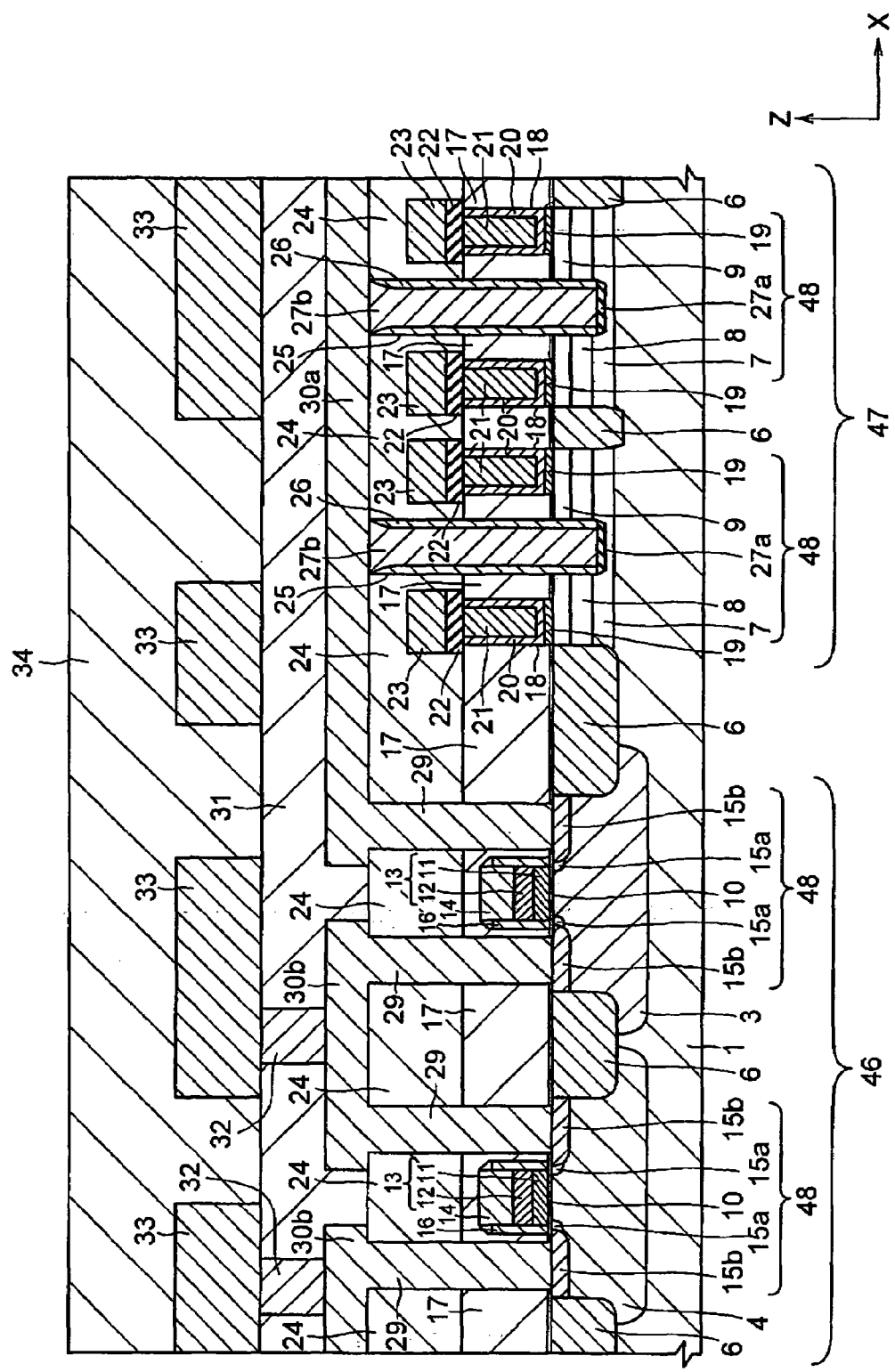
FIG. 3 is a sectional view taken along line A-A' in FIG. 2.

FIG. 3 shows a partial sectional view of a substantially final structure of the PCRAM shown in FIG. 1, wherein a PCRAM array area 47 is shown on the right side and a peripheral circuit area 46 is shown on the left side. The accompanying sectional views including FIG. 3 are taken along line in FIG. 2, if not otherwise specified. In the surface area of the semiconductor substrate 1 is formed an isolation region 6, which divides the surface area of the semiconductor substrate 1 into an array of active regions 48.

Each of the active regions 48 of the PCRAM array area 47 include a heavily-doped n-type semiconductor layer (n-type layer) 7, a lightly-doped n-type layer 8 and a heavily-doped p-type semiconductor layer (p-type layer) 9, which are consecutively disposed as viewed from the bottom of the semiconductor substrate 1 in the whole active region 48. The lightly-doped n-type layer 8 and heavily-doped p-type layer 9 configure the p-n junction of the diode 43. The heavily-doped n-type layer 7 is connected to the overlying bit line 30$a$ via the bit-line contact plug 27$b$ covered by a silicon nitride sidewall film 26. The bottom of the bit-line contact plug 27$b$ is provided with a silicide layer 27$a$, which reduces the contact resistance between the heavily-doped n-type layer 7 and the bit-line contact plug 27$b$.

On the heavily-doped p-type layer 9 are formed a pair of bottom-electrode contact plugs 21 penetrating an interlevel dielectric film 17 in the vertical direction and sandwiching therebetween the bit-line contact plug 27$b$ in the horizontal direction. On top of each of the bottom-electrode contact plugs 21 are provided with a chalcogenide element 22 and a top electrode 23, which extends in the Y-direction to configure the selection line SL. Thus, each of the active regions 48 of the PCRAM array area 47 is provided with a pair of memory cells, which share the common bit-line contact plug 27$b$. The diodes 43 of both the memory cells are separated and isolated from each other by the sidewall film 26 formed on the side surface of the bit-line contact plug 27.

Each of the active regions 48 in the peripheral circuit area 46 is provided with p-channel MISFETs and n-channel MISFETs, which configure the peripheral circuit. Second-level interconnects 33 extend from the peripheral circuit area 46 to the PCRAM array area 47 to transmit signals therebetween.

Figure 4C:
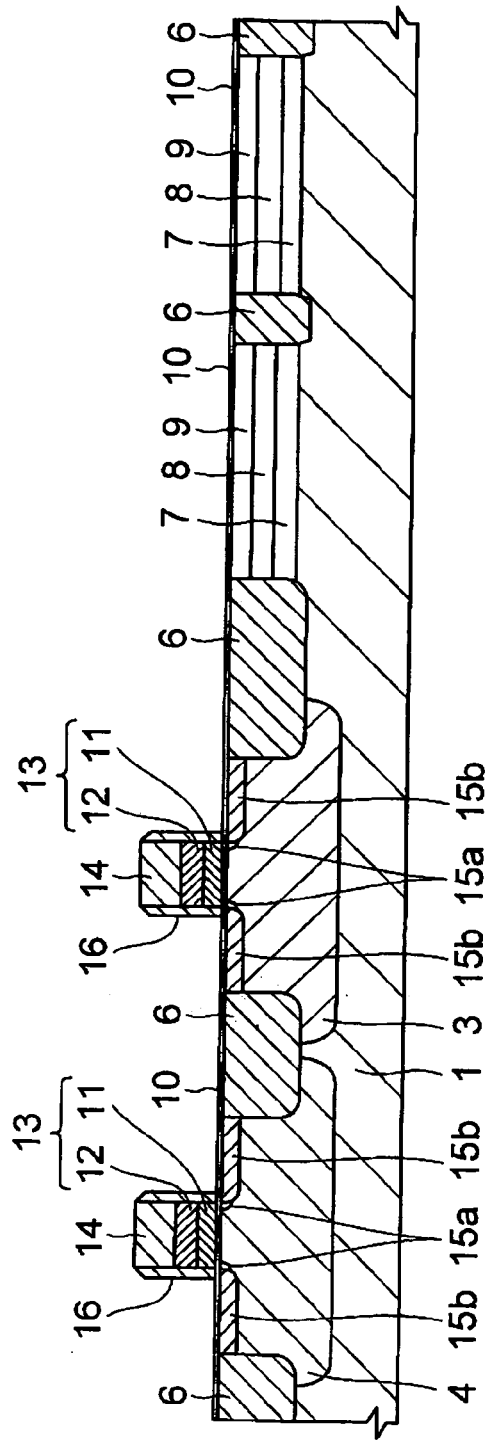

A process for manufacturing a semiconductor device according to the present embodiment will be described with reference to FIGS. 4A to 4L. First, as shown in FIG. 4A, an isolation region 6 is formed by embedding a silicon oxide film within a shallow trench 5 formed on the main surface of a semiconductor substrate 1. The shallow trench 5 is 0.3 μm deep, for example, and may be provided with a sidewall film formed in advance on th wall of the shallow trench 5 by a thermal oxidation technique. The silicon oxide film is deposited on the semiconductor substrate 1 including the shallow trench 5, and polished using a CMP process to remove the portion thereof on top of the semiconductor substrate 1. The patterned active regions in the PCRAM array area 47 are isolated from one another by the isolation region 6, and may have a rectangular shape such as shown in FIG. 2.

Thereafter, phosphorous is selectively implanted into the peripheral circuit area 46 by using a photoresist pattern as a mask to form n-wells 43, followed by selectively implanting boron into the peripheral circuit area 46 to form p-wells 3 therein. Subsequently, another selective ion-implantation is performed into the PCRAM array area 47 to form heavily-doped n-type layers 7 in the active regions 48, in which the p-n junctions of diodes 43 are to be formed. Subsequently, lightly-doped n-type layers 8 and heavily-doped p-type layers 9 configuring p-n junctions of diodes 43 are consecutively formed by ion-implantation. The impurity concentration of the lightly-doped n-type layers 8 is around 1E17 to 1E18 atoms/cm$^3$, whereas the impurity concentration of the heavily-doped p-type layers 9 is around 1E19 to 1E20 atoms/cm$^3$. An activation anneal process is then performed after those ion-implantation steps, to thereby complete p-n junctions of the diodes 43.

Thereafter, as shown in FIG. 4B, gate insulating films 10 of MISFETs are formed in the active regions 48 of the peripheral circuit area 46 by using a thermal oxidation technique. Subsequently, a polysilicon film 11 doped with impurities such as phosphorous at a concentration of $3 \times 10^{12}$ atoms/cm$^3$ is deposited to a thickness of 50 nm on the entire area of the semiconductor substrate 1, followed by depositing a tungsten film 12 having a thickness of 100 nm, for example. It is preferable to insert a tungsten nitride (WN) film between the polysilicon film 11 and the tungsten film 12 for prevention of reaction therebetween. The polysilicon film 11 may be formed by CVD, and tungsten film 12 and tungsten nitride film may be formed by sputtering. Subsequently, a silicon nitride film is deposited to a thickness of 200 nm, for example. Further, patterning is conducted using a photolithographic and etching technique to thereby obtain the gate electrodes 13 of MISFETs and overlying cap insulating films 14.

Thereafter, as shown in FIG. 4C, ion-implantation of arsenic or phosphorous is performed using the cap insulating films 14, gate electrodes 13 and a photoresist pattern as a mask to form lightly-doped diffused regions 15$a$ in the area of the peripheral circuit area 46, in which n-channel MISFETs are to be formed. Subsequently, ion-implantation of boron is performed to form lightly-doped diffused regions 15$a$ in the area in which p-channel MISFETs are to be formed.

Thereafter, a silicon nitride film is deposited on the entire surface of the semiconductor substrate 1 to a thickness of 30 nm, for example. Subsequently, as shown in FIG. 4C, the silicon nitride film is etched using an anisotropic dry etching technique to leave a portion of the same on the side surfaces of the cap insulation films 14 and gate electrodes 13, to thereby form sidewall insulation films 16. Subsequently, another silicon nitride film (not show) is deposited on the entire surface to a thickness of 20 nm, for example. The purpose of the another silicon nitride film is to suppress the amount of etching of the isolation region 6 to a minimum during forming the bottom-electrode contact holes 18, which will be described with reference to FIG. 4D.

Thereafter, a photoresist pattern is formed on the area in which n-channel MISFETs of the peripheral circuit area 46 are to be formed, followed by implanting impurities, such as boron ions, while using the photoresist pattern and sidewall insulation films 16 as a mask, to form heavily-doped diffused regions 15b configuring the source/drain regions of the p-channel MISFETs. Subsequently, another photoresist pattern is formed in the area in which p-channel MISFETs of the peripheral circuit area 46 are to be formed, followed by implanting impurities, such as phosphorous, while using the another photoresist pattern and sidewall insulation films as a mask, to thereby form heavily-doped diffused regions 15b configuring the source/drain regions of the p-channel MISFETs.

Figure 4D:
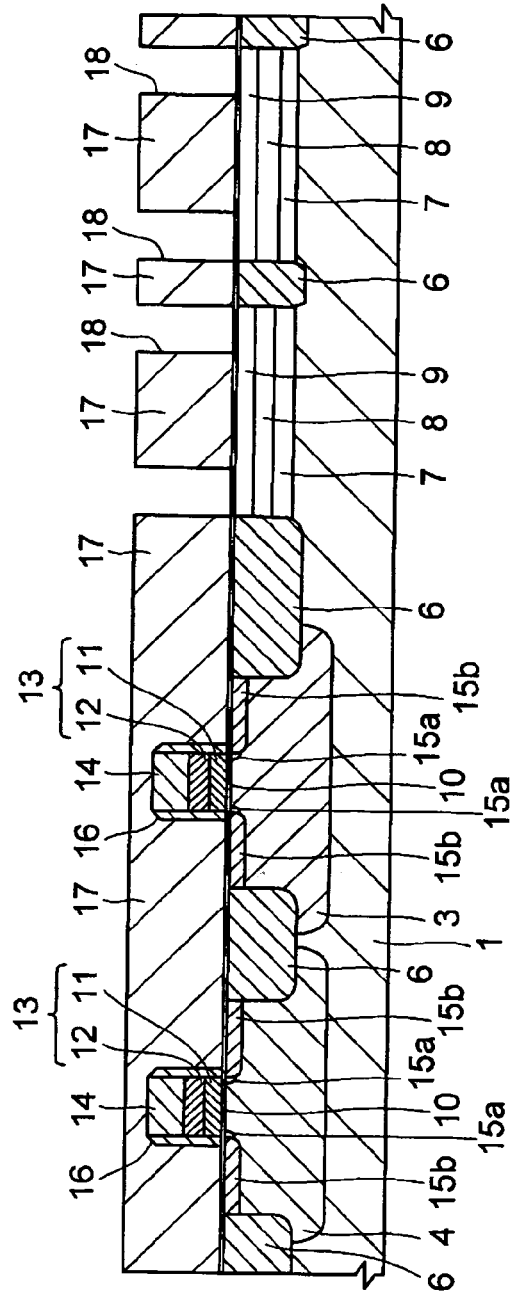

Thereafter, a silicon oxide film having a thickness of 400 nm, for example, is formed using a CVD technique, and as shown in FIG. 4D, the resultant surface is polished using a CMP technique to form an interlevel dielectric film 27. This silicon oxide film may be deposited using a TEOS (Tetramethylsilane) as a source gas. It is also possible to reflow the silicon oxide film by a heat treatment, after depositing the same while implanting boron or phosphorous. The CMP process improves the flatness of the surface of the silicon oxide film 17.

Thereafter, bottom-electrode contact holes 18 are formed in the PCRAM array area 47 by using a photolithographic and etching technique. The bottom-electrode contact holes 18 are formed in the vicinity of both the ends of the active regions 48 as viewed in the X-direction, as shown in FIG. 2. If a misalignment occurs between the bottom-electrode contact holes 18 and isolation region 6, and thus both the regions overlap each other, the isolation region 6 may be etched during etching for forming the bottom-electrode contact holes 18. In this case, the contact plugs formed in the bottom-electrode contact holes 18 may contact the p-n junctions 8, 9 to incur a malfunction. The another silicon nitride film formed in the entire area, as described before with reference to FIG. 4C, prevents such a malfunction. This structure is particularly effective in a fine memory cell structure in which a mask margin between both the patterns is especially small.

Figure 4E:
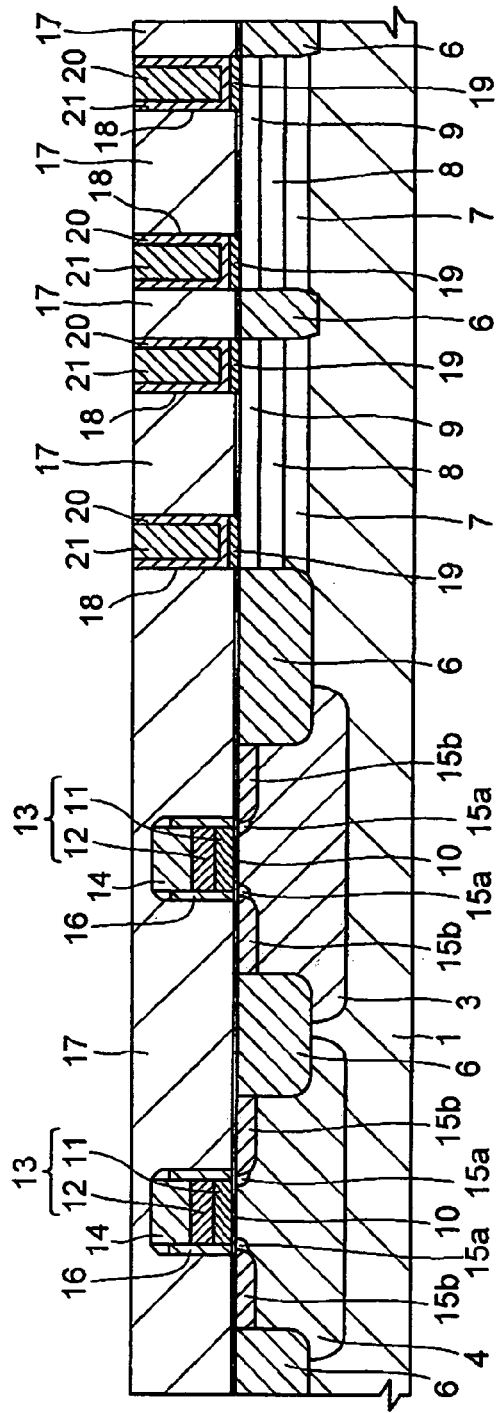

Thereafter, as shown in FIG. 4E, the bottom-electrode contact holes 18 are filled with tungsten by using a CVD technique, followed by CMP thereof to form contact plugs 21. The material for the contact plugs 21 may be another metal such as copper instead of tungsten. However, a high-melting-point metal is preferred as the material for the contact plugs 21, in view that the thermal treatment diffuses the metallic atoms toward the semiconductor substrate 1 to degrade the reliability of the PCRAM device. Examples of the preferred material for the contact plugs 21 include metals such as molybdenum (Mo), tantalum (Ta) and niobium (Nb), and metal nitrides such as titanium nitride (TiN), tantalum nitride S (TaN), tungsten nitride (WN) and titanium-aluminum nitride (TiAlN).

Before forming a metallic film for the contact plugs 21, a metal silicide film 19 is formed on the surface of the heavily-doped p-type layers 9 in order for assuring a superior contact between the contact plugs 21 and the p-type regions 9. The metal silicide film may be cobalt silicide, titanium silicide, tantalum silicide, tungsten silicide etc. A barrier metal film 20 may be preferably interposed between the metal silicide film 19 and the contact plugs 21 for assuring a superior contact between the metal silicide film 19 and the contact plugs 21. The barrier metal film 20 may be a titanium nitride film such as deposited using a CVD technique. The barrier metal film 20 and contact plugs 21 configure the bottom electrodes of the phase-change memory cells 42, which contact the phase change material.

Figure 4F:
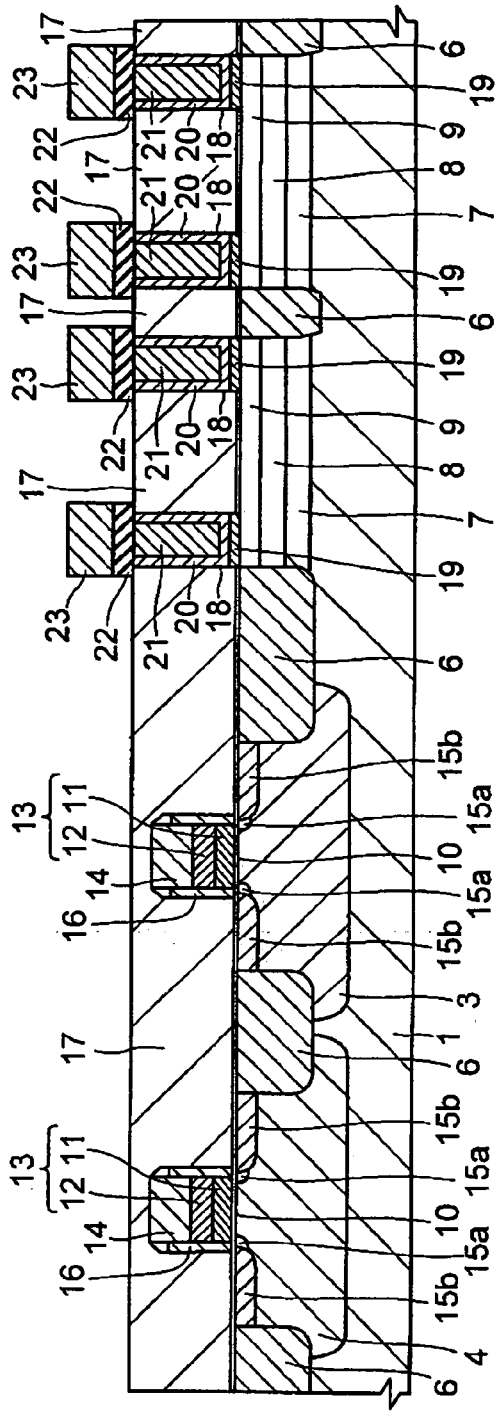

Thereafter, as shown in FIG. 4F, a chalcogenide film 22 and a top electrode film 23 are deposited in the PCRAM array area 47. The chalcogenide film 22 may be $Ge_2Sb_2Te_5$, for example, sputtered to a thickness of 50 to 200 nm, whereas the top electrode film 23 may be tungsten, for example, sputtered to a thickness of around 100 nm. The chalcogenide film 22 and top electrode film 23 are then patterned using a photolithographic and etching technique, to form chalcogenide elements 42 such as shown in FIG. 2. The chalcogenide film 22 may include two or more of germanium (Ge), antimony (Sb), tellurium (Te) and selenium (Se), for example.

The top electrodes 23 may include materials other than tungsten, such as exemplified for the bottom electrodes. If the top electrodes 23 directly configure the selection lines SL, the top electrodes 23 may be preferably overlaid by a second metallic film for reducing the sheet resistance of the selection lines SL. The second metallic film should have a lower resistivity than the material used for the top electrode 23.

Figure 4G:
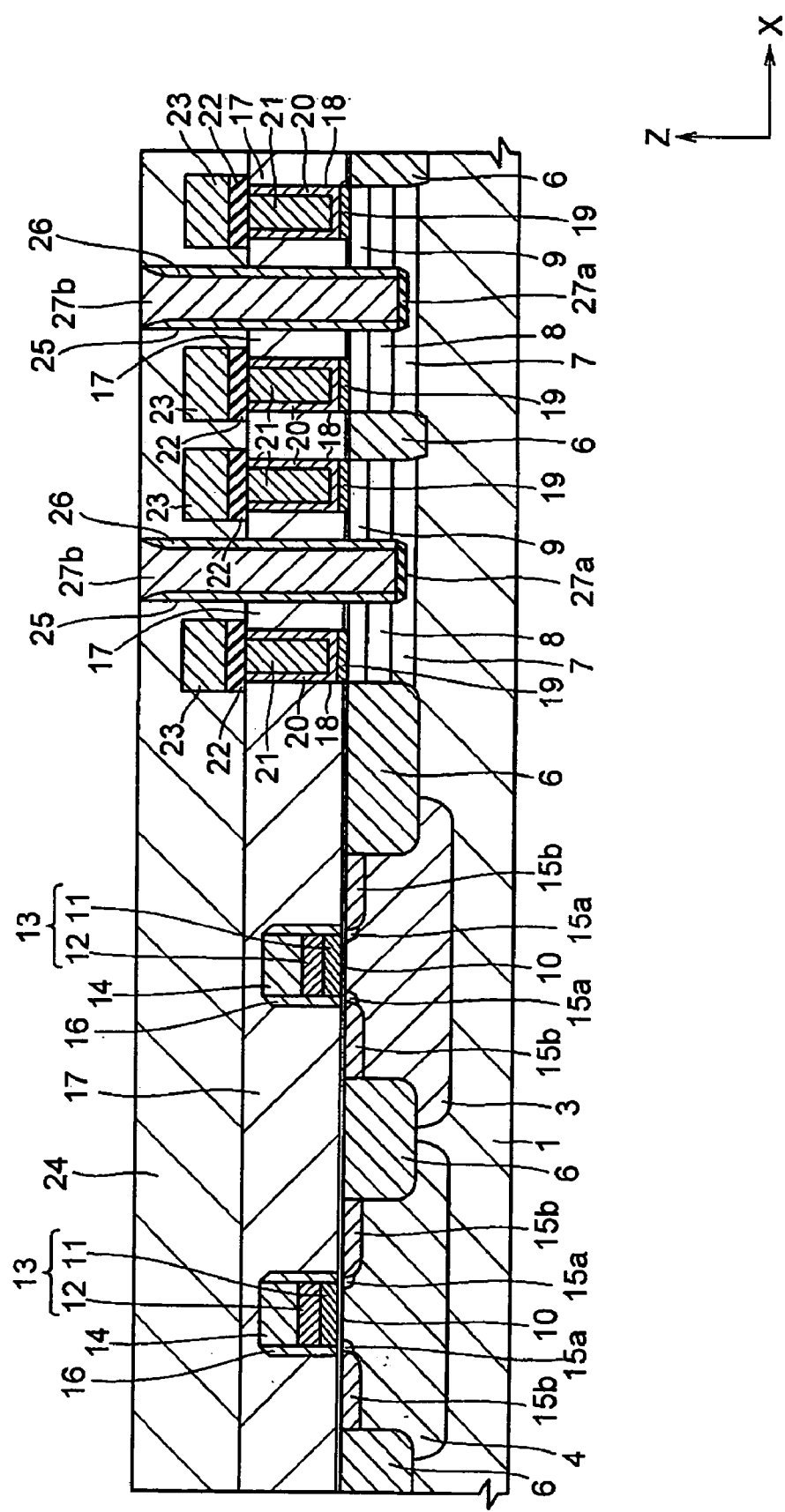

Thereafter, as shown in FIG. 4G, bit-line contact holes 25 are formed in the PCRAM array area 47 by using a photolithographic and etching technique. In this step, interlevel dielectric films 17, 24 are first etched using a photoresist pattern as a mask, followed by etching the heavily-doped p-type layers 9 and lightly-doped n-type layers 8 configuring the p-n junctions while using the thus etched interlevel dielectric films 17, 24 as mask, and additionally etching a portion of the heavily-doped n-type layers 7 underlying the p-n junction.

The bit-line contact holes 25 are provided with silicon nitride film 26 formed on the inner wall of the bit-line contact holes 25, for the purpose of insulating the bit-line contact plugs 27b from the heavily-doped p-type layers 9 and lightly-doped n-type layers 8 configuring the p-n junctions. The silicon nitride film 26 is deposited using a thermal CVD technique, followed by anisotropic dry etching thereof to leave the same on the inner wall of the bit-line contact holes 25.

Thereafter, a tungsten film is deposited using a CVD technique on the entire surface of the semiconductor substrate 1, followed by CMP thereof to leave the same within the bit-line contact holes 25 and thereby form bit-line contact plugs 27b. It is preferable to form a silicide film 27a, such as made of cobalt, titanium, tantalum and tungsten, in advance between the bit-line contact plugs 27b and the heavily-doped n-type layers 7 for assuring a superior contact therebetween.

FIG. 4H shows a sectional view taken normal to the section of FIG. 4G and showing the same step as FIG. 4G. As shown in FIG. 4H, the bit-line contact plugs 27b are formed across the width of the active regions 48 isolated by the isolation region 6.

Figure 4I:
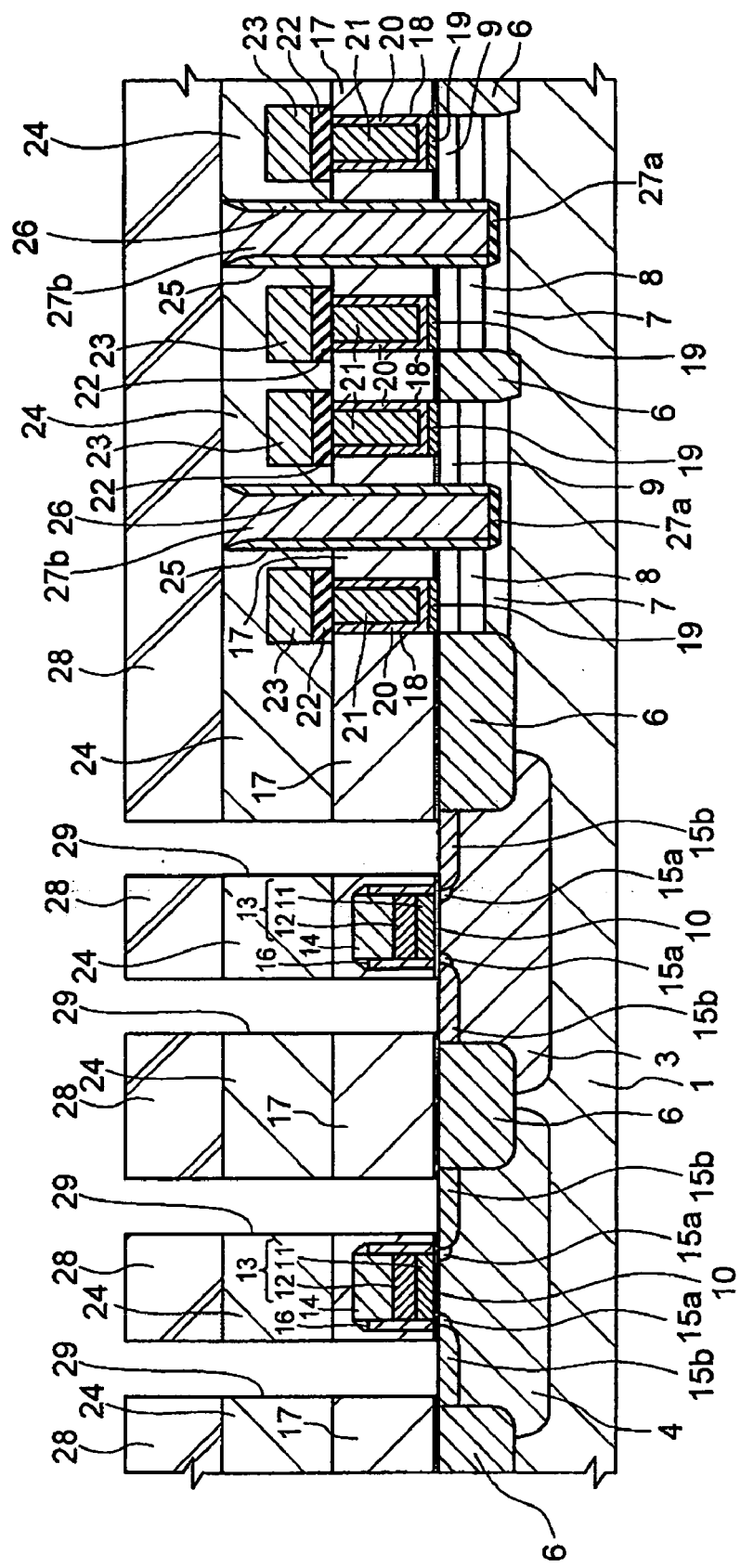

Thereafter, as shown in FIG. 4I, the contact holes 29 in the peripheral circuit area 46 are formed by a photolithographic and etching technique using a photoresist mask 28 as a mask to dry-etch interlevel dielectric films 24 and 17. The photoresist mask 28 covers the PCRAM array area 47 to protect the bit-line contact plugs 27b in the PCRAM array area 47 from being etched in this dry etching.

Figure 4J:
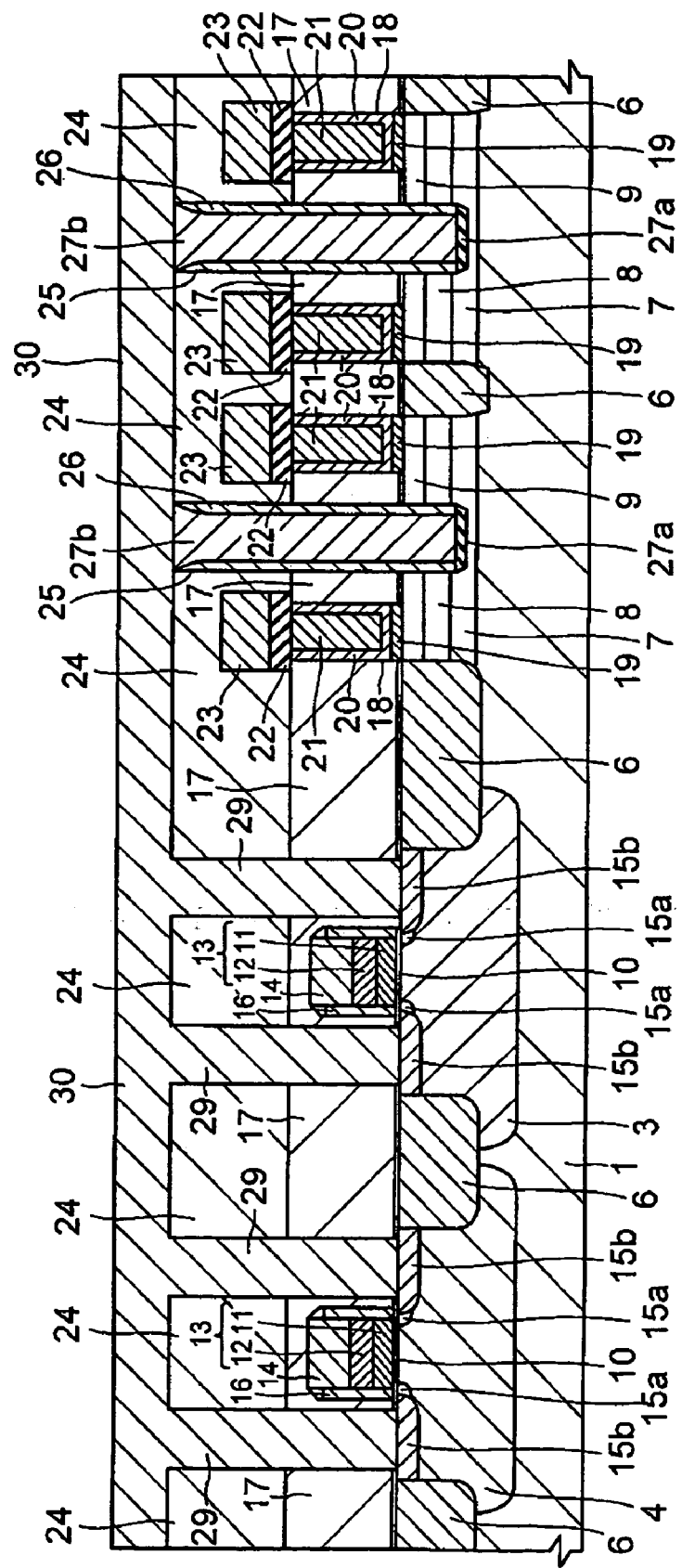

Thereafter, as shown in FIG. 4J, a tungsten film 30 for forming therefrom bit lines 30a is deposited on the entire surface of the semiconductor substrate 1 by using a CVD technique, for example. It is preferable to form a silicide film 27a in advance on the heavily-doped diffused regions 15b for assuring a superior contact between the bit lines 30a and the heavily-doped source/drain regions 15b of the MISFETs in the peripheral circuit area 46. This silicide film may 27a be a silicide of cobalt, titanium, tantalum and tungsten, for example.

Figure 4K:
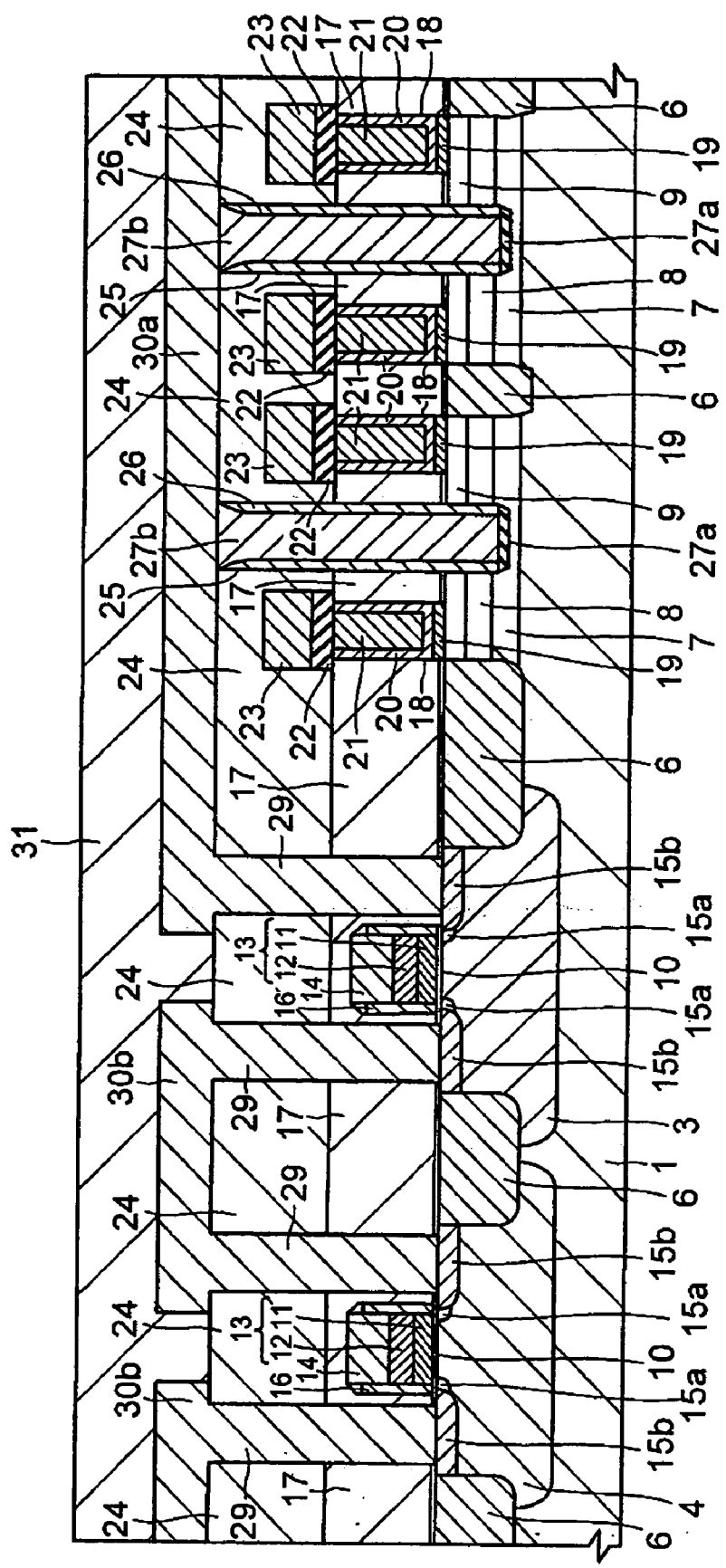

Thereafter, as shown in FIG. 4K, the tungsten film 30 is patterned using a photolithographic and etching technique to form first-level interconnects. The resultant first-level interconnects include bit lines 30a in the PCRAM array area 47, and local interconnects 30b in the peripheral circuit area 46. Subsequently, a silicon oxide film is formed as another interlevel dielectric film 31 by using a plasma-enhanced CVD technique. The interlevel dielectric film 31 is then patterned using a dry etching technique to form desired via-holes.

Figure 4L:
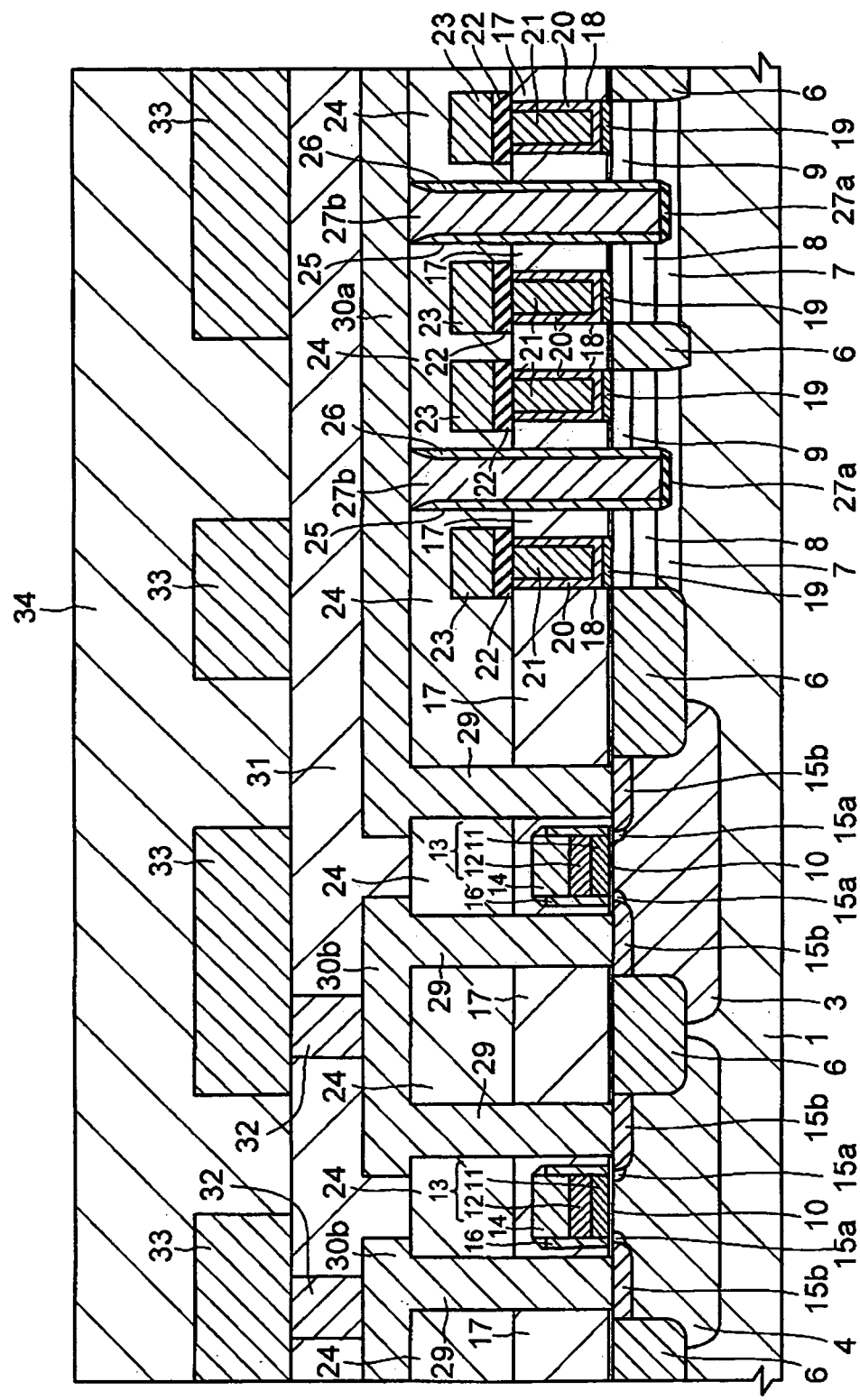

Thereafter, as shown in FIG. 4L, second-level interconnects 33 are formed which connect to the first-level interconnects 30a, 30b through via-plugs 32. The second-level interconnects 33 may have a layered structure including titanium nitride, aluminum and titanium nitride, for example. The via-plugs 32 may also have a layered structure including titanium, titanium nitride and tungsten. Third-level interconnects or higher-level interconnects may be formed with an intervention of corresponding interlevel dielectric film or films by using known techniques after the steps of FIG. 4L, although not specifically described herein.

Figure 5A:
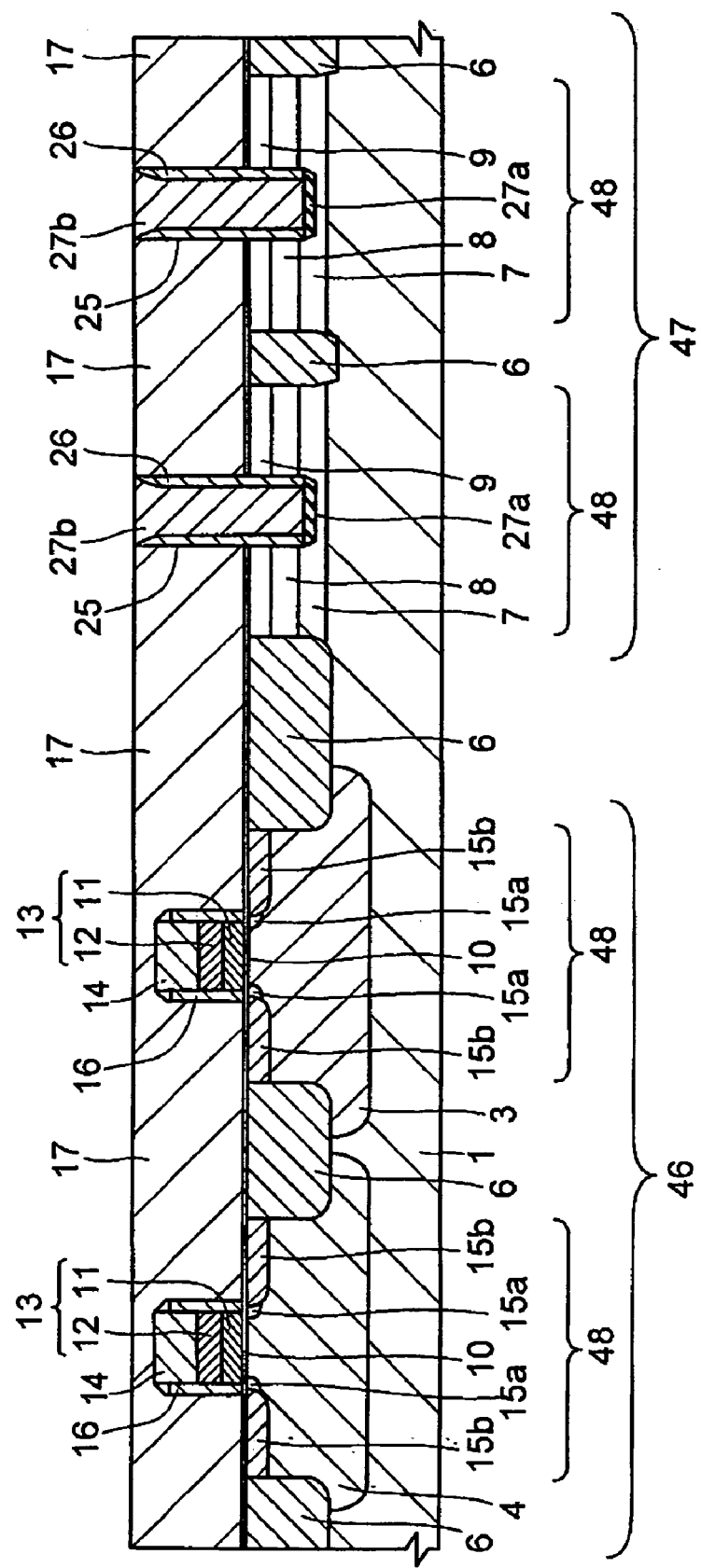
FIGS. 5A to 5C are sectional views of a semiconductor device according to a second embodiment of the present device according to a second embodiment of the present invention in consecutive steps of fabrication process thereof.
Figure 5B:
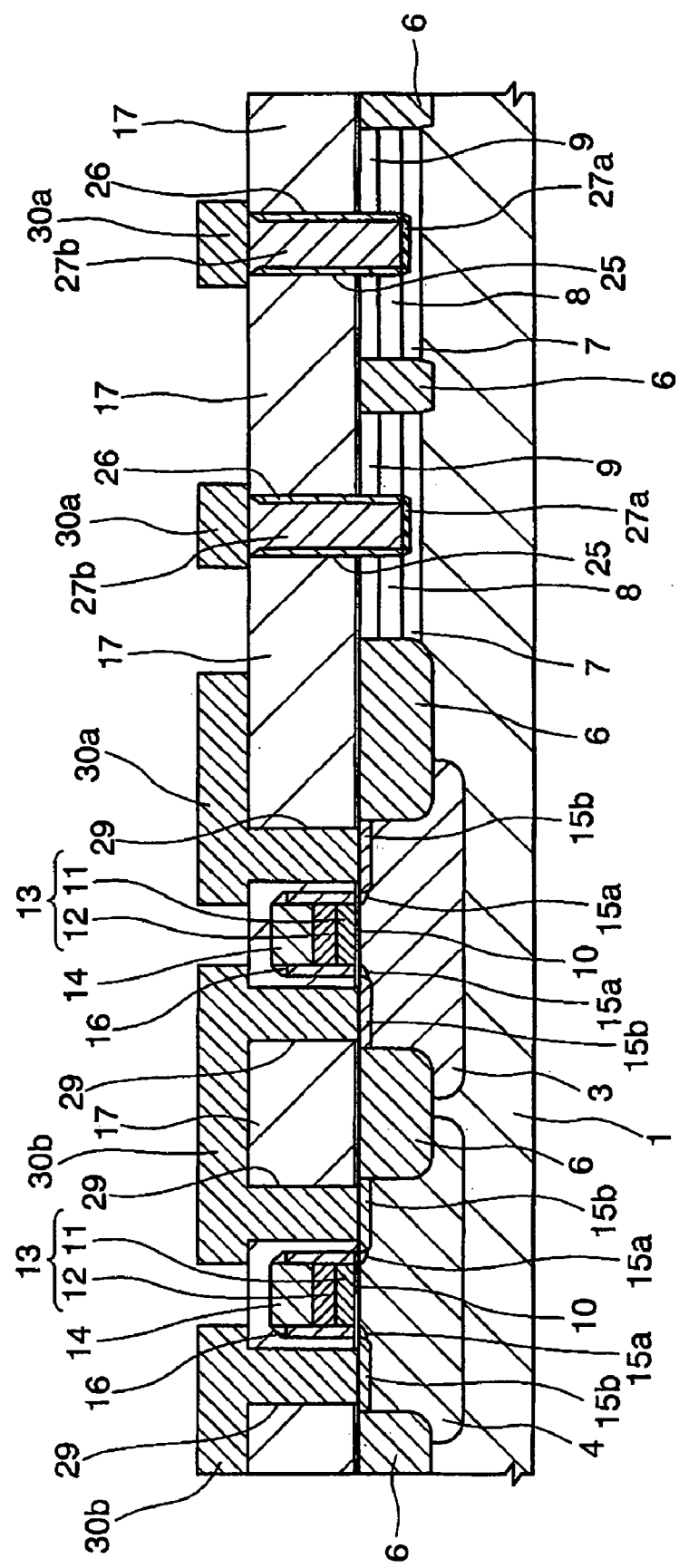
Figure 5C:
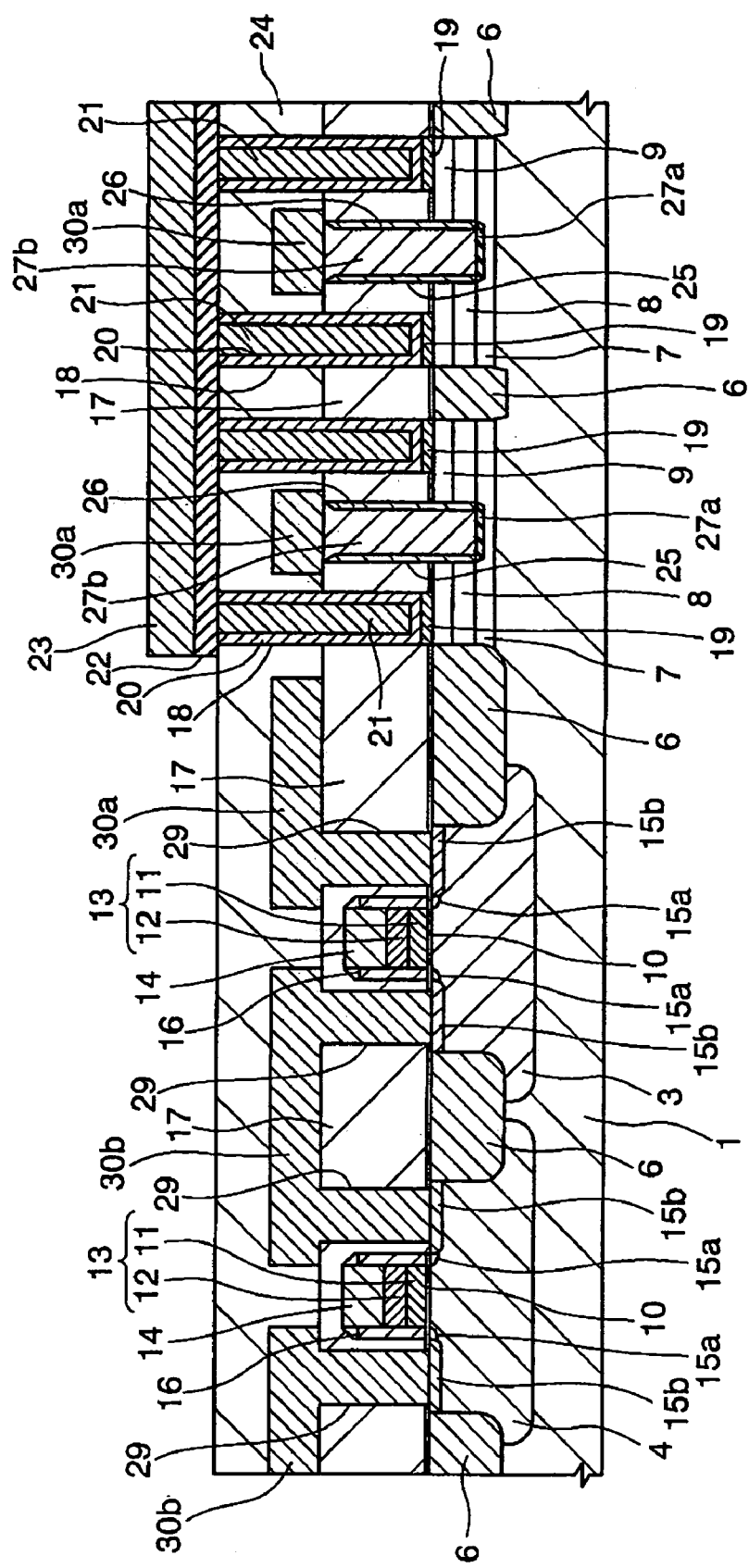

FIGS. 5A to 5C are sectional views showing a semiconductor device according to a second embodiment of the present invention in consecutive steps of a fabrication process thereof. The process for the present embodiment is similar to the process for the first embodiment except that the bit lines 30a and bit-line contact plugs 27b are formed prior to formation of the-chalcogenide elements.

More specifically, the steps for the present embodiment are similar to the steps up to the step of FIG. 4C for the first embodiment. After the step of FIG. 4C, an interlevel dielectric film 17 is deposited, followed by forming bit-line contact plugs 25, sidewall insulation film 26, silicide film 27a and bit-line contact plugs 27b by the steps similar to the steps described with reference to FIG. 4E, to obtain the structure shown in FIG. 5A.

Thereafter, contact holes 29 and local interconnects 30b in the peripheral circuit area 46 and the bit lines 30a in the PCRAM array area 47 are formed by the steps similar to the steps described with reference to FIGS. 4J and 4K, to obtain the structure show in FIG. 5B. Subsequently, bottom-electrode contact holes 18 for memory cells are formed, followed by forming top electrodes 23 in the steps similar to the steps described with reference to FIG. 4L, as shown in FIG. 5C. In this step, the bottom-electrode contact holes 18 are formed in the PCRAM array area 47 to expose therethrough the surface of the semiconductor substrate 1 by etching the interlevel dielectric films 17, 24. The bottom-electrode contact holes 18 are then filled with bottom-electrode contact plugs 21, followed by forming a chalcogenide film pattern 22 and the top electrodes 23 on top of the bottom-electrode contact plugs 21, thereby forming the structure of the phase-change memory elements 42.

In the PCRAM device of the second embodiment, the smaller length of the bit-line contact plugs 25 compared to that in the first embodiment affords improvement in controllability of the length of the bit-line contact plugs 25. In addition, formation of the chalcogenide elements 42 including the chalcogenide film 22 after the formation of transistors allows reduction in the number of heat treatments applied to the chalcogenide elements 42, thereby suppressing degradation of the chalcogenide elements 42.

FIGS. 6A to 6D are sectional views of a semiconductor device according to a third embodiment of the present invention in consecutive steps of fabrication thereof. In the present embodiment, the bit-line contact holes 25 in the PCRAM array area 47 and the contact holes 29 in the peripheral circuit area 46 are formed concurrently with each other, thereby reducing the number of process steps. In addition, since the bit lines 30 are provided with the cap insulation films 35 and sidewall insulation films 36 to form a bit-line structure, the bottom-electrode contact holes 18 to be formed later in the PCRAM array area 47 can be formed in self-alignment with the bit line structure, to thereby reduce the unit cell area by reducing the margin for the mask alignment.

Figure 6A:
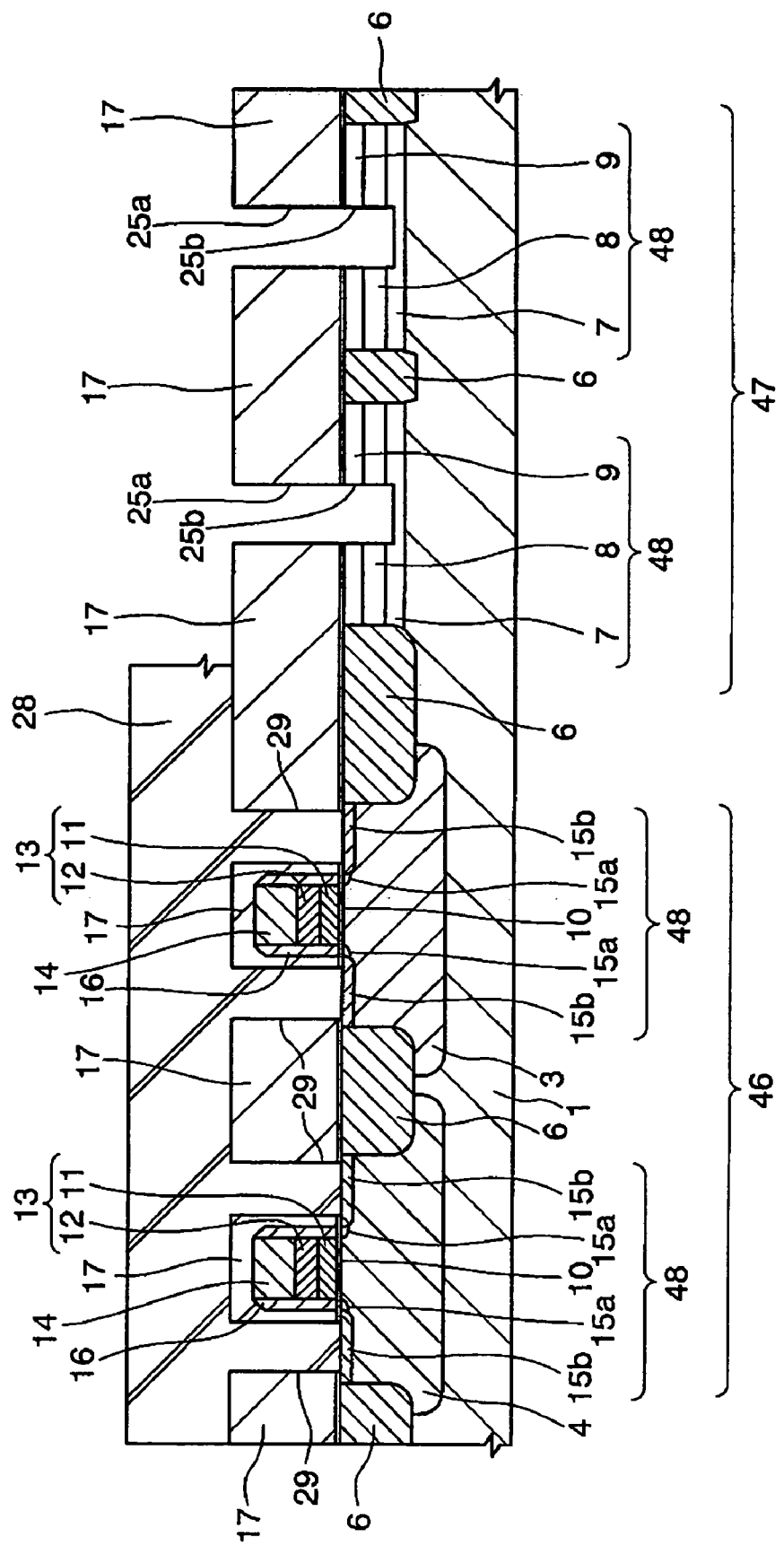
FIGS. 6A to 6D are sectional views of a semiconductor device according to a third embodiment of the present invention in consecutive steps of fabrication process thereof.

More specifically, as shown in FIG. 6A, the bit-line contact holes 25 in the PCRAM array area 47 and the contact holes 29 in the peripheral circuit area 46 are formed concurrently with each other. The process for forming the bit-line contact holes 25 in the PCRAM array area 47 includes first and second dry etching steps. The first dry etching step etches the interlevel dielectric film 17 to form upper contact holes 25a for exposing therethrough the surface of the semiconductor substrate 1. The second dry etching step etches the semiconductor substrate 1 to the depth of central portion of the heavily-doped n-type layers 7, while using the upper contact holes 25a formed in the first dry etching as a mask, to thereby form lower contact holes 25b. During the second dry etching step, the contact holes 29 formed in the peripheral circuit area 46 are covered by the photoresist mask 28 and thus the semiconductor substrate 1 are not etched in the peripheral circuit area 46.

Figure 6B:
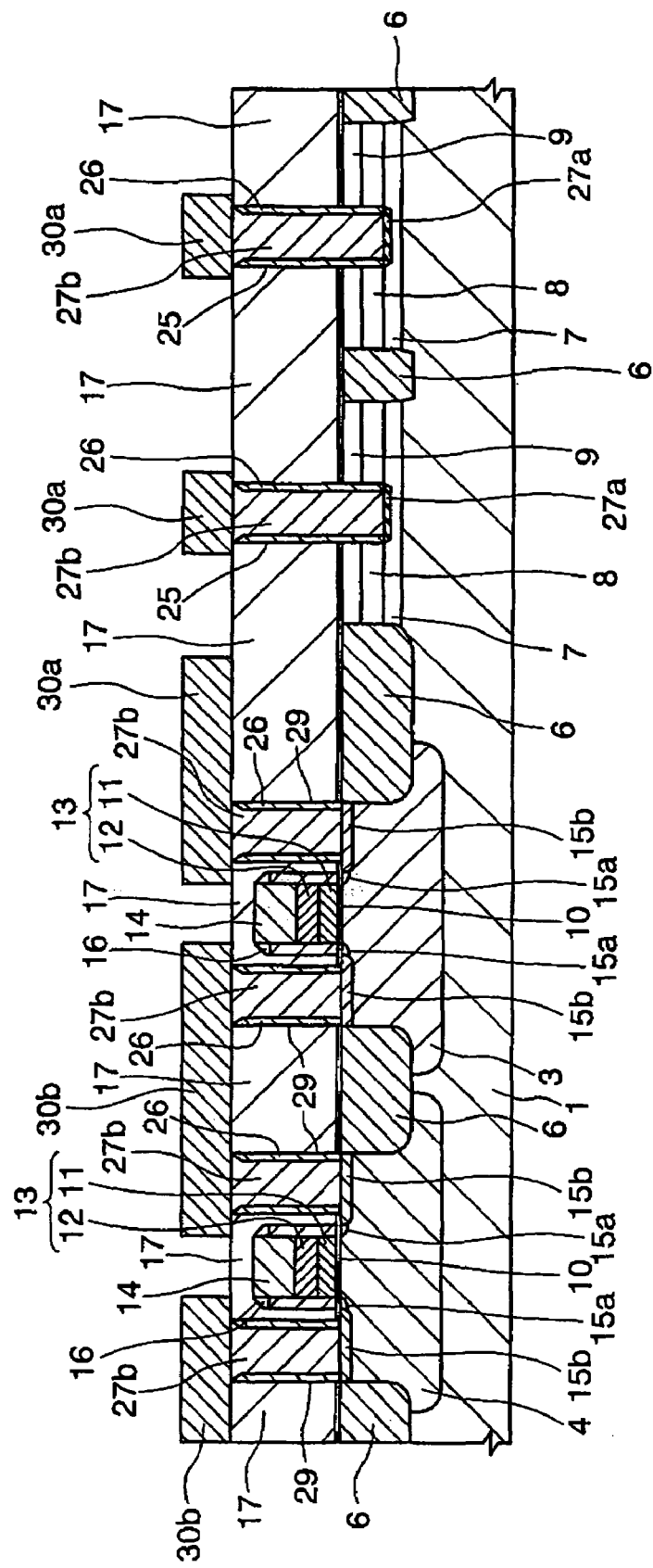

Thereafter, as shown in FIG. 6B, the bit-line contact holes 25 in the PCRAM array area 47 and the contact holes 29 in the peripheral circuit area 46 are filled with metallic plugs 27b. This step is conducted similarly to the step for the second embodiment described with reference to FIG. 5A. Subsequently, bit lines 30a in the PCRAM array area 47 and the local interconnects 30b in the peripheral circuit area 46 are formed by sputtering a tungsten film and patterning the same while using a photolithographic and dry etching technique.

Figure 6C:
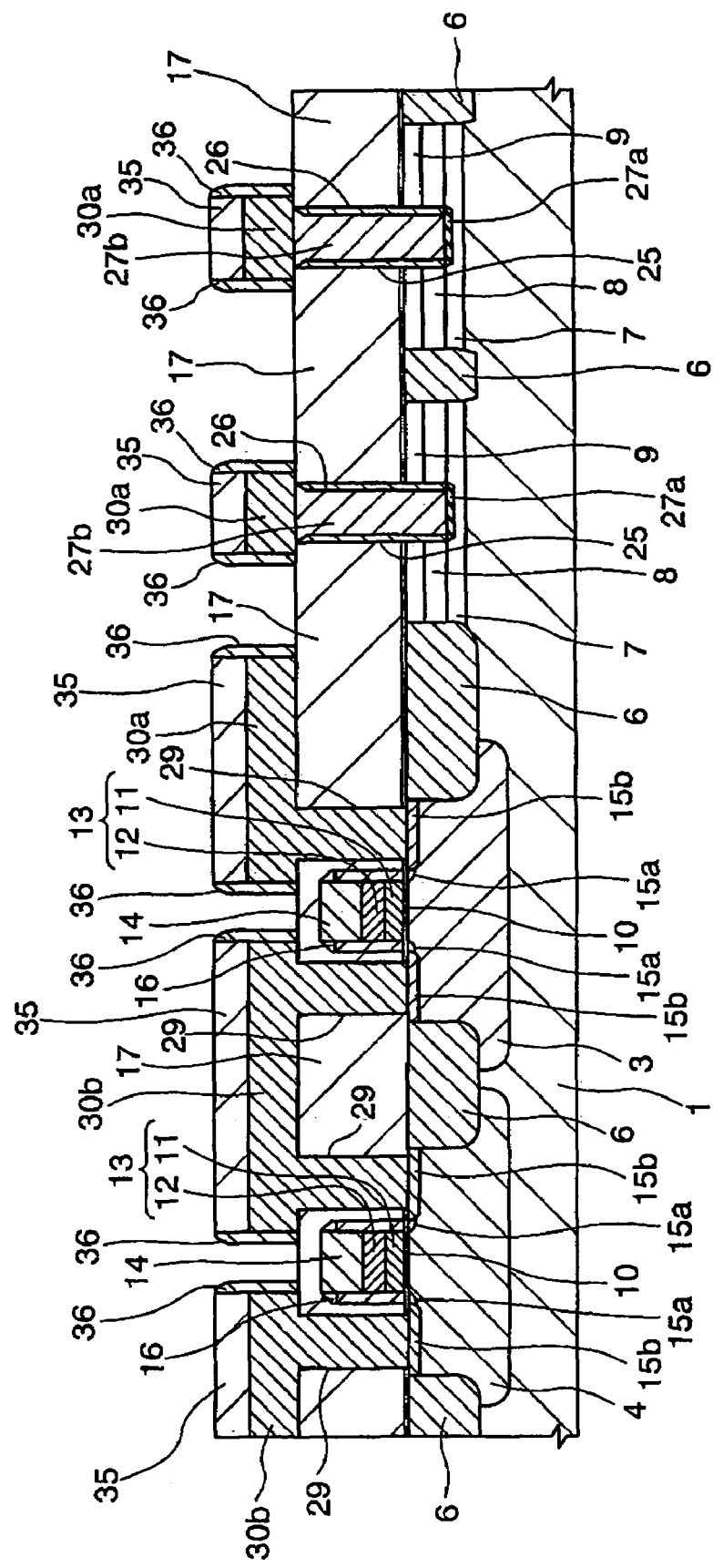

Thereafter, as shown in FIG. 6C, a silicon nitride film is deposited using a plasma-enhanced CVD technique and patterned using a photolithographic and dry etching technique to form cap insulating films 35 on the respective bit lines 30a and local interconnects 30b. Subsequently, another silicon nitride film is deposited using a plasma-enhanced CVD technique and patterned using a photolithographic and anisotropic dry etching technique to form sidewall insulation films 36 extending from the cap insulation films 35 on the side surfaces of the bit lines 30a and local interconnects 30b. The cap insulation films 35 and sidewall insulation films 36 may be omitted from this process.

Figure 6D:
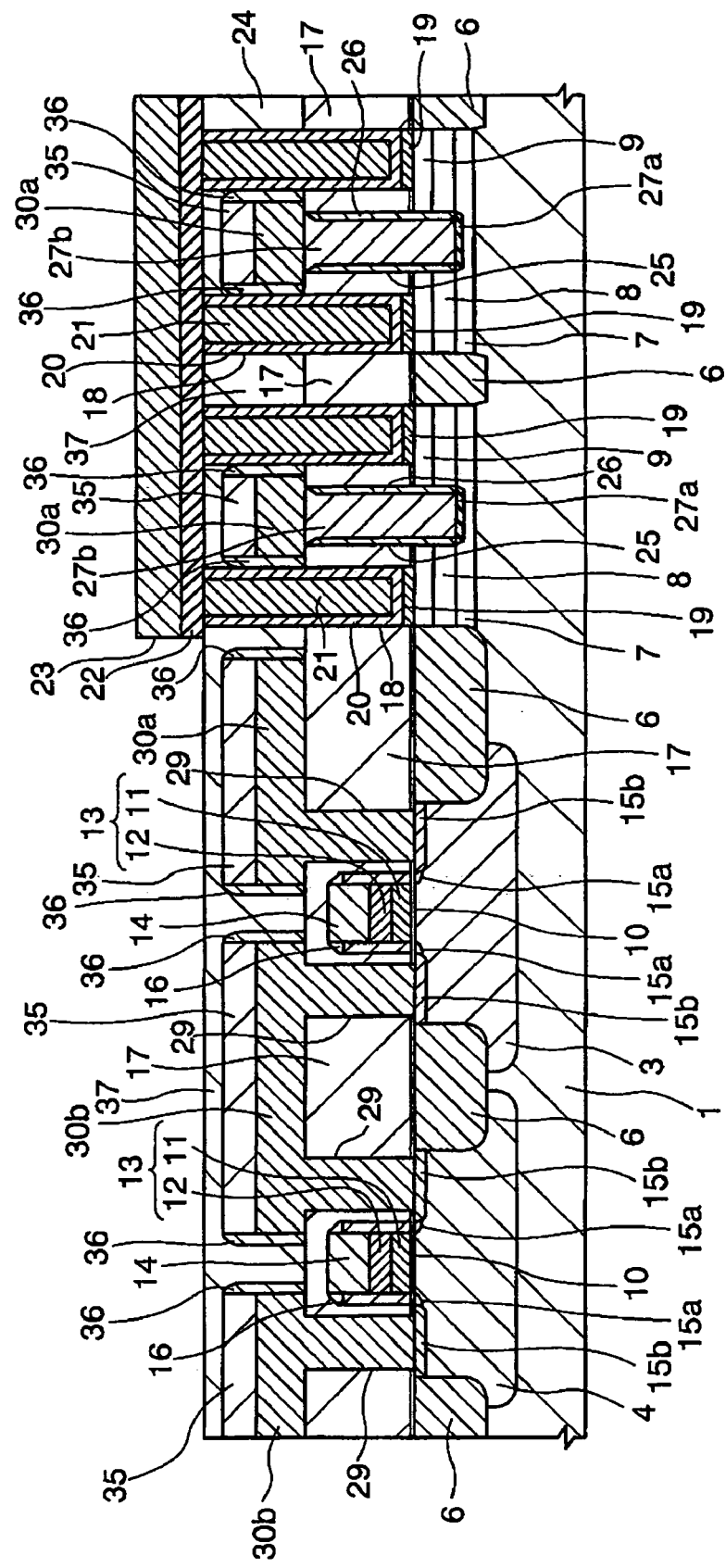

Thereafter, bottom-electrode contact holes 18 for the PCRAM cells are formed similarly to the steps for the second embodiment. The silicon nitride films including the cap insulation films 35 and sidewall insulation films 36 act as a stopper during the dry etching for forming the bottom-electrode contact holes 18 for the PCRAM cells, whereby the bottom-electrode contact holes 18 can be formed in self-alignment with the bit line structure, as will be understood from FIG. 6D showing the final structure.

Figure 7A:
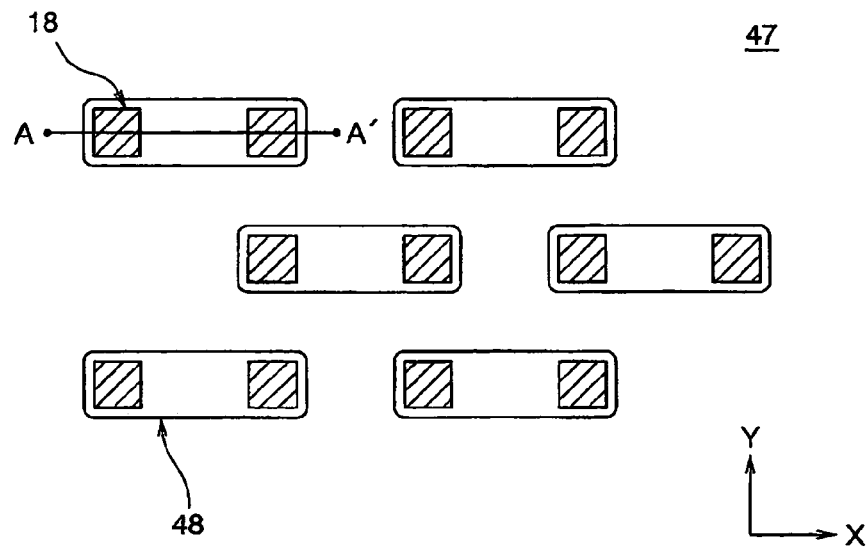
FIGS. 7A to 7D are top plan views of the semiconductor device of FIGS. 4A to 4L in consecutive steps of fabrication process thereof.

FIGS. 7A to 7D show top plan views of the PCRAM array area 47 in the semiconductor device of the first embodiment of the present invention in consecutive steps of the fabrication thereof described with reference to FIGS. 4A to 4L. FIG. 7A shows the step of forming the active regions 48 and bottom-electrode contact holes 18, wherein the bottom-electrode contact holes 18 are formed in the vicinity of both the ends of the active regions 48 as viewed in the X-direction. Two of the active regions 48 adjacent to one another in the Y-direction are deviated from one another by a half pitch.

Figure 7B:
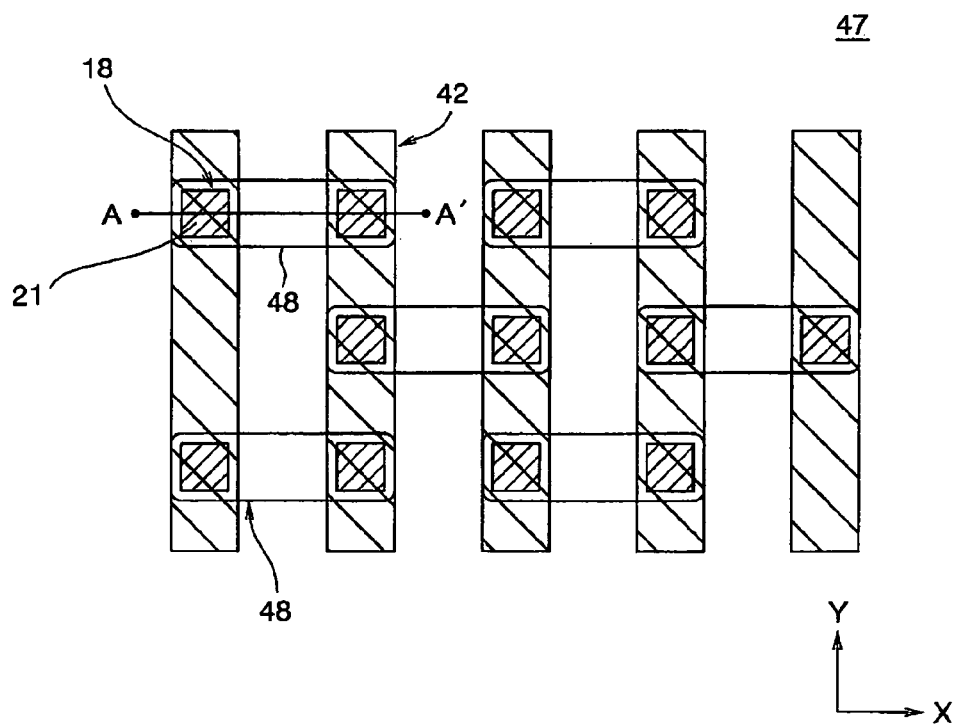

FIG. 7B shows the step of forming the chalcogenide elements 42, wherein the chalcogenide elements 42 are formed on top of the bottom-electrode contact plugs 21 filling the bottom-electrode contact holes 18 and extend along the column of bottom-electrode contact plugs 21 arranged in the Y-direction.

Figure 7C:
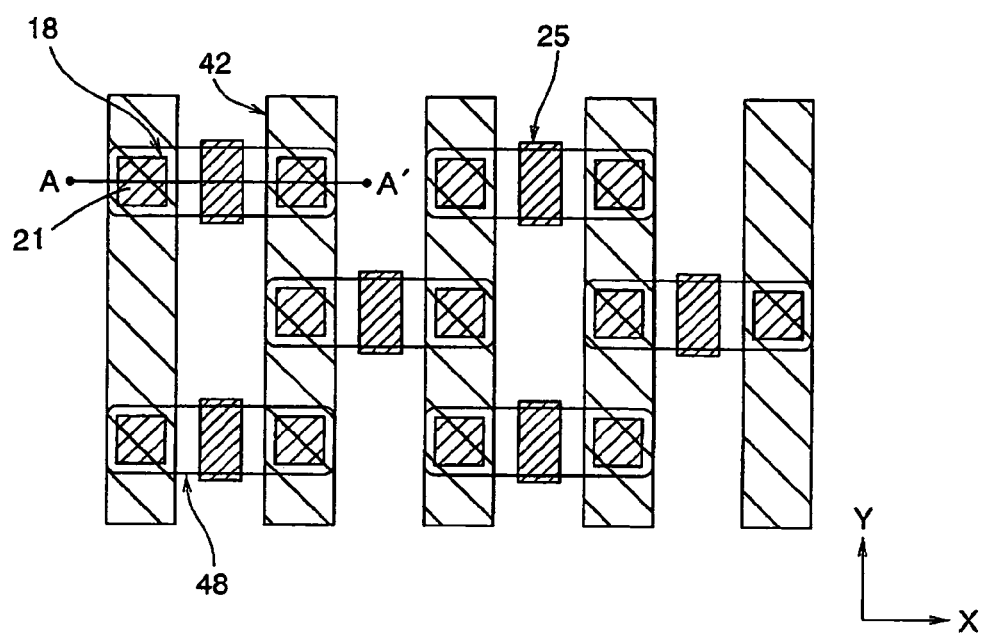
Figure 7D:
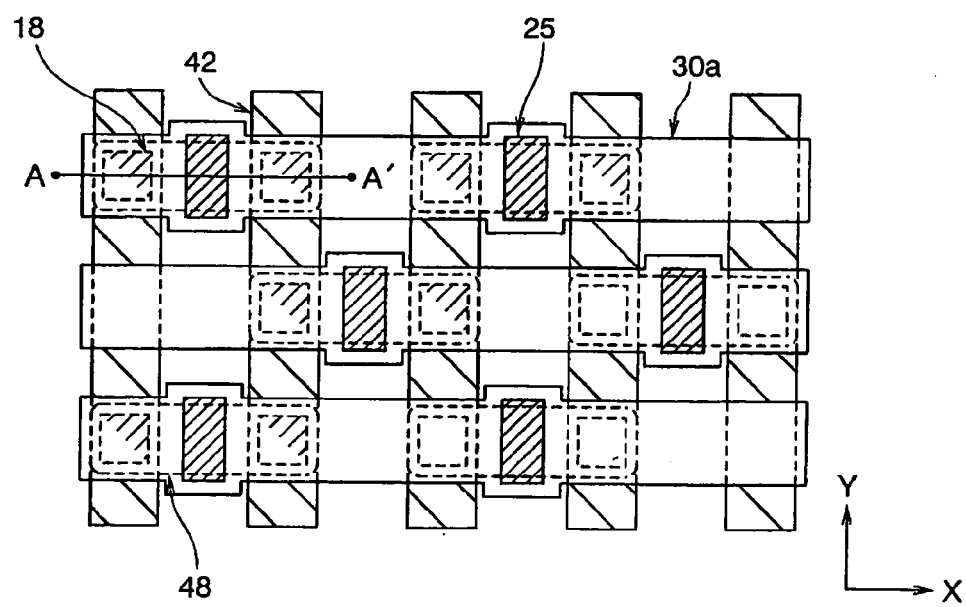

FIG. 7C shows the step of forming the bit-line contact holes 25, wherein the bit-line contact holes 25 are disposed at the center of the distance between bottom-electrode contact holes 18 in two memory cells disposed adjacent to one another in the X-direction, and the two memory cells share a common bit-line contact plug 27b. FIG. 7D shows the step of forming bit lines 30a, wherein the bit lines 30a extend on top of the row of the bit-line contact holes 25 arranged in the X-direction and aligned with those bit-line contact holes 25.

Figure 8A:
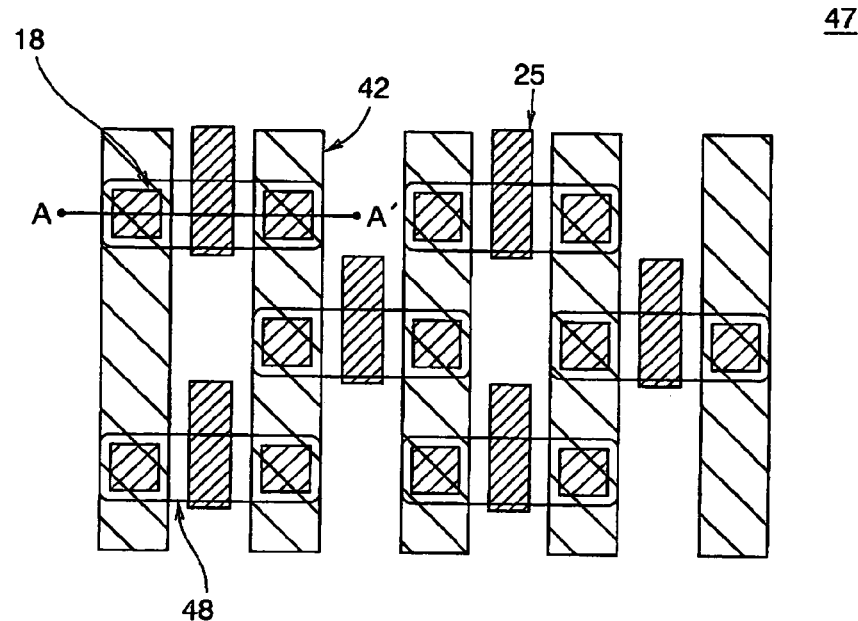
FIGS. 8A and 8B are top plan views of a semiconductor device according to a modification from the first embodiment in consecutive steps of fabrication process thereof.
Figure 8B:
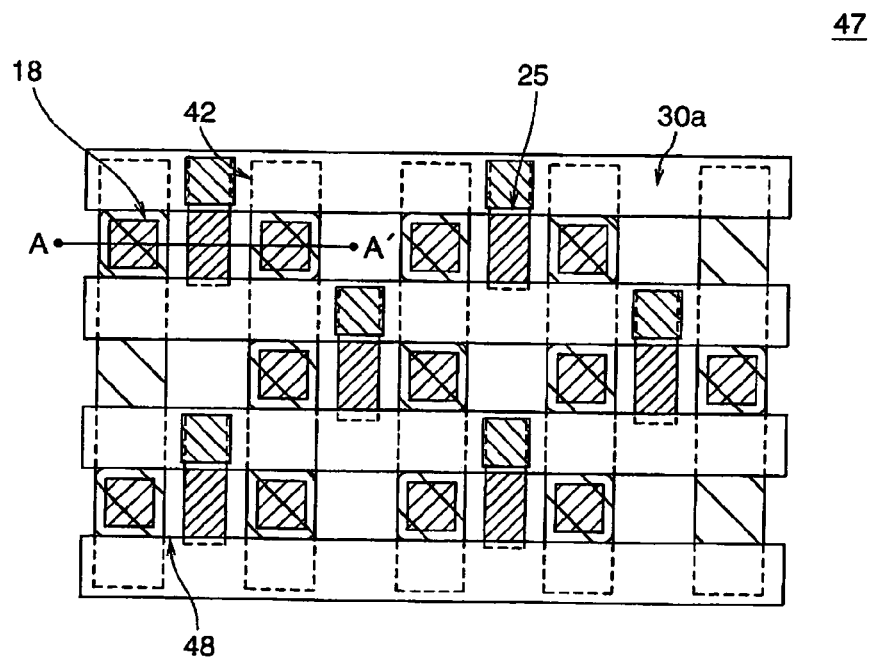

FIGS. 8A and 8B are top plan views of a semiconductor device according to a modification from the first embodiment, showing the steps corresponding to the steps of FIGS. 7C and 7D, respectively. In this modification, the bit-line contact plugs 25 have a width larger than the width of the bottom-electrode contact plugs 18, and the bit lines 30a extend to deviate from the row of the bottom-electrode contact holes 18.

Figure 9A:
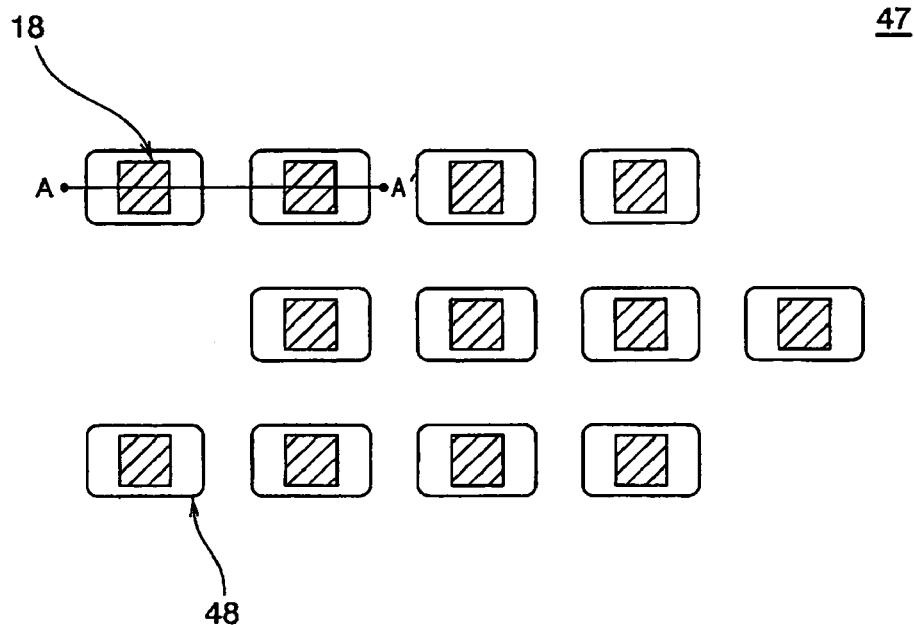
FIGS. 9A to 9D are top plan views of a semiconductor device according to another modification from the first embodiment, in consecutive steps of fabrication process thereof.

FIGS. 9A to 9D are top plan views of a semiconductor device according to another modification from the first embodiment, showing the steps corresponding to the steps of FIGS. 7A to 7D, respectively. In FIG. 9A, an isolation film is formed on the semiconductor substrate 1 to divide the PCRAM array area 47 into a plurality of isolated active regions 48 each including a single memory cell. The active regions are each provided with a heavily-doped n-type layer 7, a lightly-doped n-type layer 8 and a heavily-doped p-type layer 9, which are similarly to those in the first embodiment, and also provided with a single bottom-electrode contact hole 18.

Figure 9B:
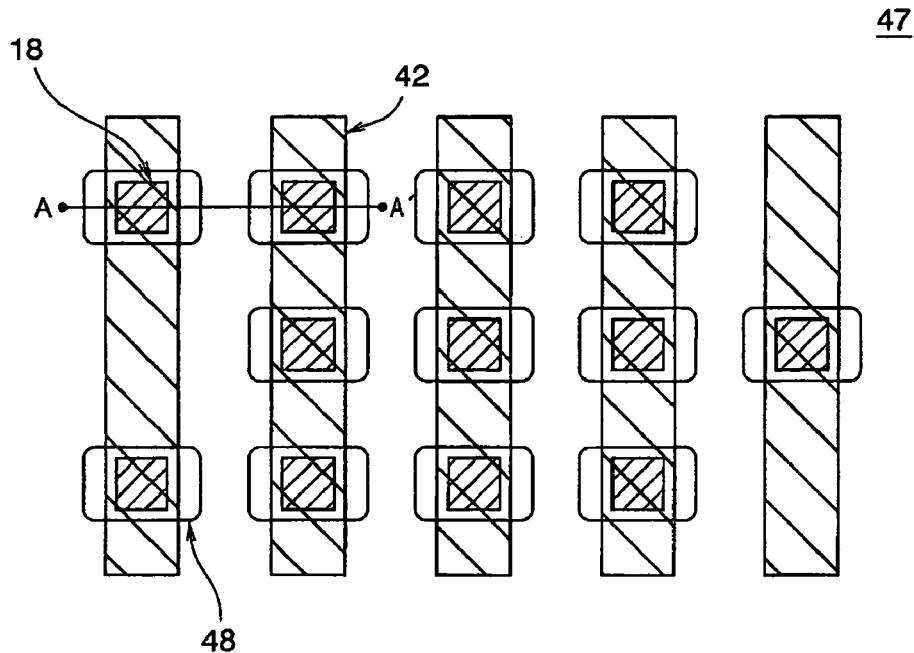
Figure 9C:
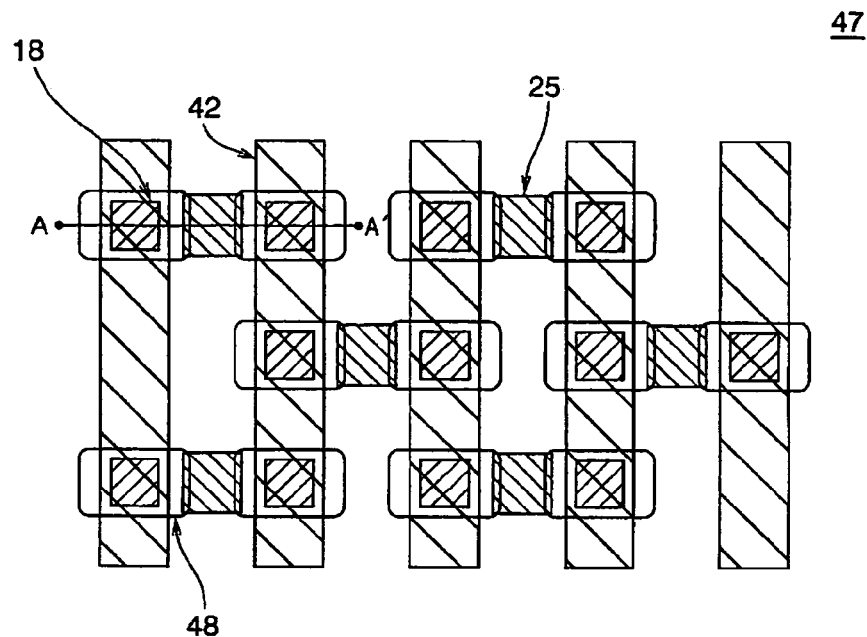
Figure 9D:
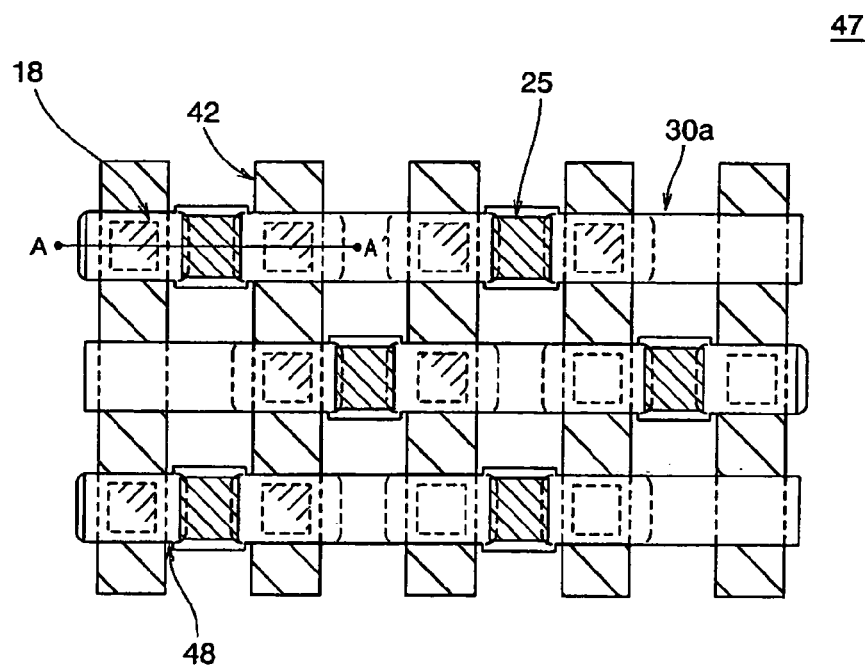
Figure 10A:
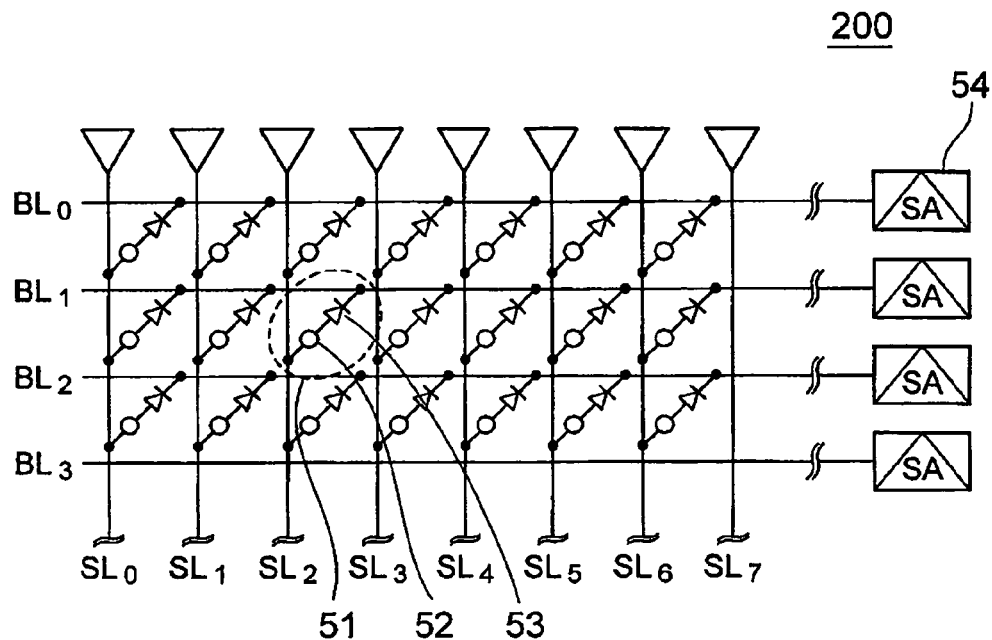
FIGS. 10A and 10B are circuit diagram and a sectional view, respectively, of a conventional semiconductor device including phase-change memory cells.
Figure 10B:
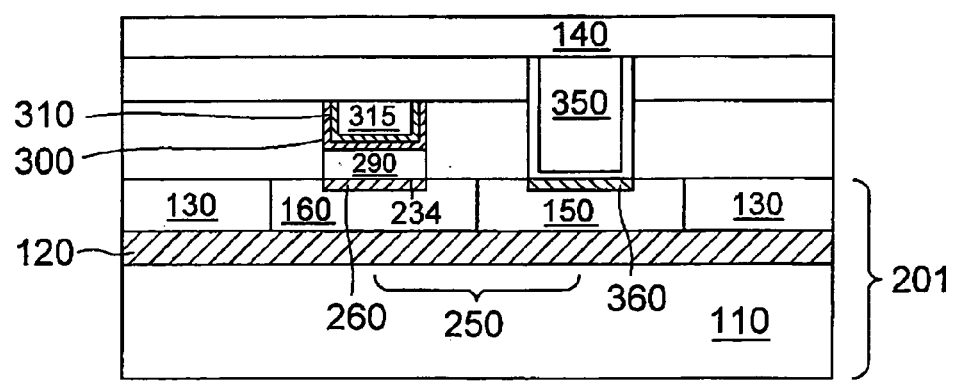

Subsequently, as shown in FIG. 9B, chalcogenide elements 42 are formed each corresponding to a column of the active regions 48 arranged in the Y-direction. Bit-line contact holes 25 are then formed each penetrating the isolation film and overstriding edge portions of adjacent two of the active regions 48 which are adjacent to each other in the row direction, as shown in FIG. 9C. The bit-line contact holes 25 are filled with respective contact plugs each covered with a sidewall insulation film. The bit-line contact plugs are also provided with a silicide film on the bottom surface thereof, such as denoted by 27a in FIG. 3. Subsequently, bit lines 30a are formed on top of the bottom-electrode contact plugs, chalcogenide elements 42 and bit-line contact plugs to extend in the X-direction.

In the another modification, a single active region is provided with a single chalcogenide element, and two of the memory cells adjacent to one another in the X-direction share a common bit-line contact plug.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising:
  a semiconductor substrate;
  a plurality of bit lines overlying said semiconductor substrate and extending parallel to one another;
  a plurality of selection lines overlying said semiconductor substrate, extending parallel to one another, and intersecting said bit lines; and
  an array of phase-change memory cells each disposed for one of intersections between said bit lines and said selection lines, each of said memory cells being connected between a corresponding one of said bit lines and a corresponding one of said selection lines,
  wherein adjacent two of said memory cells share a single bit-line contact plug connected to a corresponding one of said bit lines.

2. The semiconductor memory device according to claim 1, wherein each of said memory cells includes a phase-change memory element and a diode connected in series with said phase-change memory element, and said diode has a p-n junction configured by an n-type semiconductor layer electrically connected to said bit-line contact plug and a p-type semiconductor layer overlying said n-type semiconductor layer.

3. The semiconductor memory device according to claim 2, wherein said diodes in said adjacent two of said memory cells configure a pair of diodes formed in a single active region, and both diodes in said pair are isolated from each other by an insulating film covering said shared bit-line contact plug.

4. The semiconductor memory device according to claim 2, wherein said diodes in said adjacent two of said memory cells configure a pair of diodes formed in separate active regions, and said n-type semiconductor layers in said pair of diodes are connected together by said shared bit-line contact plug.

5. The semiconductor memory device according to claim 2, wherein said each of shared bit-line contact plugs penetrates said n-type and p-type semiconductor layers while isolated therefrom and is in contact with another n-type semiconductor layer which underlies said n-type semiconductor layer in contact therewith.

6. The semiconductor memory device according to claim 2, wherein said diodes in said adjacent two of said memory cells comprise a pair of diodes formed in a single active region.

7. The semiconductor memory device according to claim 2, wherein said diodes in said adjacent two of said memory cells comprise a pair of diodes formed in separate active regions.

8. The semiconductor memory device according to claim 2, wherein said each of said shared bit-line contact plugs penetrates said n-type and p-type semiconductor layers.

9. The semiconductor memory device according to claim 2, wherein said each of said shared bit-line contact plugs penetrates said n-type and p-type semiconductor layers while isolated therefrom.

10. The semiconductor memory device according to claim 1, wherein said bit lines overlie said memory cells and said selection lines.

11. The semiconductor memory device according to claim 1, wherein said selection lines overlie said bit lines.

12. The semiconductor memory device according to claim 11, wherein each of said bit lines has a sidewall insulation film, and a contact plug connecting together one of said selection lines and one of said memory cells is deposited in self-alignment with said sidewall insulation film.

13. The semiconductor memory device according to claim 1, wherein each of said bit lines has a sidewall insulation film, and a contact plug connecting together one of said selection lines and one of said memory cells, and
  wherein one of said memory cells is deposited in self-alignment with said sidewall insulation film.

14. The semiconductor memory device according to claim 1, wherein each of said bit lines has a sidewall insulation film, and a contact plug connecting together one of said selection lines and one of said memory cells.

15. The semiconductor memory device according to claim 1, wherein said adjacent two of said memory cells are connected to a pair of diodes formed in a single active region.

16. The semiconductor memory device according to claim 1, wherein said adjacent two of said memory cells are connected to a pair of diodes formed in separate active regions.

17. The semiconductor memory device according to claim 1, wherein said bit-lines have a sidewall insulation film.

* * * * *